United States Patent
Aoki et al.

(10) Patent No.: US 7,504,317 B2
(45) Date of Patent: Mar. 17, 2009

(54) MANUFACTURING METHOD OF SEMICONDUCTOR DEVICE

(75) Inventors: Tomoyuki Aoki, Kanagawa (JP); Tomoko Tamura, Kanagawa (JP); Takuya Tsurume, Tochigi (JP); Koji Dairiki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 27 days.

(21) Appl. No.: 11/600,070

(22) Filed: Nov. 16, 2006

(65) Prior Publication Data

US 2007/0128833 A1    Jun. 7, 2007

(30) Foreign Application Priority Data

Dec. 2, 2005   (JP) .............................. 2005-348780

(51) Int. Cl.
*H01L 21/46* (2006.01)
(52) U.S. Cl. .................. 438/460; 438/68; 438/113; 438/455; 438/458; 438/462; 438/464
(58) Field of Classification Search .............. 438/460, 438/68, 113, 455, 458, 462, 464
See application file for complete search history.

(56) References Cited

U.S. PATENT DOCUMENTS

| 7,354,801 | B2 * | 4/2008 | Sugiyama et al. | ........... 438/113 |
| 2005/0106839 | A1 * | 5/2005 | Shimoda et al. | ............. 438/458 |
| 2006/0011288 | A1 | 1/2006 | Watanabe et al. | |
| 2007/0128747 | A1 * | 6/2007 | Tamura et al. | ................ 438/22 |

FOREIGN PATENT DOCUMENTS

| JP | 2005-311333 | 11/2005 |
| WO | WO 2005/091370 A1 | 9/2005 |
| WO | WO 2005/119781 A1 | 12/2005 |
| WO | WO 2006/011665 A1 | 2/2006 |

\* cited by examiner

*Primary Examiner*—Andy Huynh
(74) *Attorney, Agent, or Firm*—Nixon Peabody LLP; Jeffrey L. Costellia

(57) ABSTRACT

It is an object to provide a manufacturing method of a semiconductor device with high reliability. A plurality of first semiconductor integrated circuits, a plurality of second semiconductor integrated circuits each of which is arranged to be adjacent to one of the first semiconductor integrated circuits, a plurality of third semiconductor integrated circuits each of which is arranged to be adjacent to one of the first semiconductor integrated circuits and one of the second semiconductor integrated circuits, and a plurality of fourth semiconductor integrated circuits each of which is arranged to be adjacent to one of the first semiconductor integrated circuits, one of the second semiconductor integrated circuits, and one of the third semiconductor integrated circuits are formed over a first substrate. The first semiconductor integrated circuits are transferred to a second substrate. A first protective layer is formed to cover the first semiconductor integrated circuits and a surface of the second substrate in the periphery of the first semiconductor integrated circuits. The second substrate and the first protective layer are divided so that the plurality of the first semiconductor integrated circuits is divided into individual pieces and part of the second substrate remains in the periphery of the first semiconductor integrated circuits. Accordingly, a semiconductor device having the first semiconductor integrated circuit is manufactured.

13 Claims, 11 Drawing Sheets

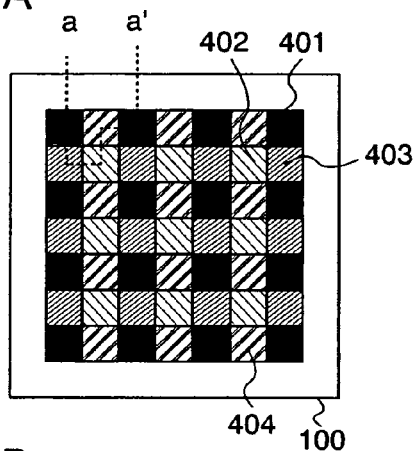

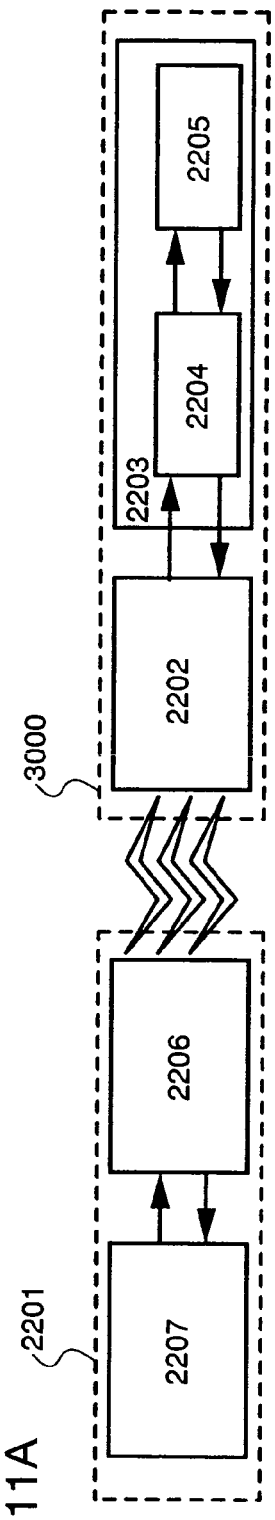
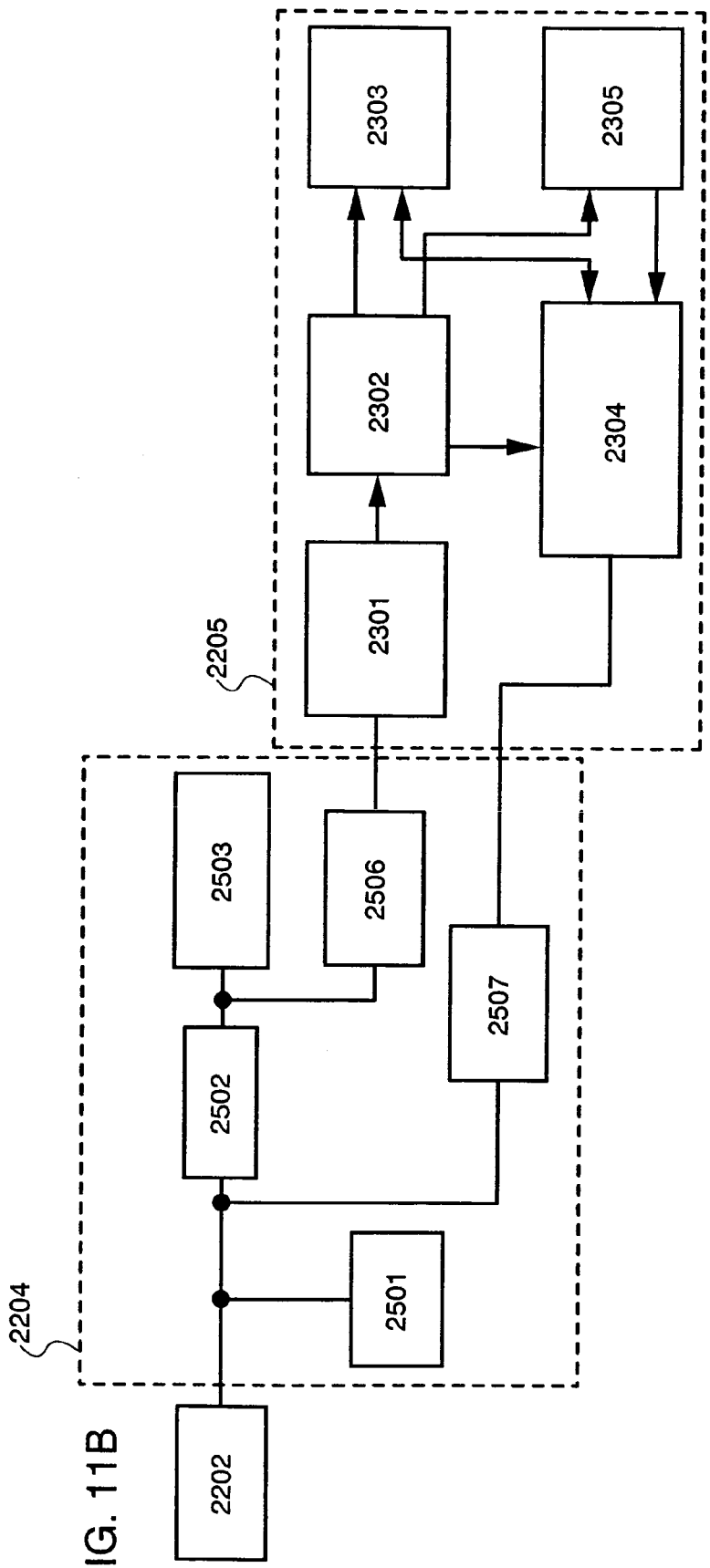
FIG. 11A
FIG. 11B

MANUFACTURING METHOD OF SEMICONDUCTOR DEVICE

BACKGROUND OF THE INVENTION

1. Field of the Invention

The present invention relates to a manufacturing method of a semiconductor device. In particular, the present invention relates to a manufacturing method of a semiconductor device which inputs and outputs data by wireless communication.

2. Description of the Related Art

A manufacturing method of a semiconductor device provided with a semiconductor integrated circuit over a flexible substrate has been proposed. In this method, first, a plurality of semiconductor integrated circuits is formed using a thin film transistor over a first substrate, which is not flexible and is formed from a thick glass or the like. The plurality of the semiconductor integrated circuits is formed while keeping a predetermined distance from each other over the first substrate. The plurality of the semiconductor integrated circuits is transferred from the first substrate to a flexible second substrate. The plurality of the semiconductor integrated circuits is all transferred from the first substrate to the second substrate concurrently; therefore, also over the second substrate, the plurality of the semiconductor integrated circuits is arranged while keeping the predetermined distance from each other. Thereafter, the second substrate is divided to be separated into individual semiconductor integrated circuits, thereby obtaining a plurality of semiconductor devices (refer to description in Patent Document 1: Japanese Published Patent Application No. 2005-311333). The predetermined distance becomes a margin for division (hereinafter, referred to as a division margin or a scribe margin) in obtaining the plurality of the semiconductor devices by dividing the second substrate.

In manufacturing the plurality of the semiconductor integrated circuits over the first substrate, an insulating film formed over an entire surface of the first substrate is used for an insulating film such as an interlayer insulating film included in the plurality of the semiconductor integrated circuits. Therefore, the insulating film exists between the plurality of the semiconductor integrated circuits over the first substrate. By a conventional manufacturing method of a semiconductor device, the plurality of the semiconductor integrated circuits is transferred all together from the first substrate to the second substrate. Therefore, also over the second substrate, the insulating film exists between the plurality of the semiconductor integrated circuits. Accordingly, when the second substrate is divided to be separated into individual semiconductor integrated circuits, a structure is obtained, in which the insulating film included in the semiconductor integrated circuits is exposed in a cross section formed by the division. Therefore, even if a protective layer is formed to cover the semiconductor integrated circuits to seal the semiconductor integrated circuits, there is a problem that an external impurity intrudes in the semiconductor integrated circuits through the insulating film. Thus, it has been difficult to ensure reliability of the semiconductor integrated circuits.

SUMMARY OF THE INVENTION

In view of the foregoing problem, it is an object of the present invention to provide a manufacturing method of a semiconductor device with high reliability.

One feature of a manufacturing method of a semiconductor device of the present invention is to transfer a plurality of semiconductor integrated circuits formed over a first substrate to other substrates through multiple transfer operations (hereinafter, referred to as "a technique for transfer through multiple transfer operations").

In particular, one feature of the present invention is to use plural types of insulating layers (a first insulating layer and a second insulating layer) as insulating layers for adhering semiconductor integrated circuits and another substrate in transferring a plurality of semiconductor integrated circuits to the other substrate. Each of the first insulating layer and the second insulating layer has different adhesive force with the semiconductor integrated circuits. The first insulating layer is selectively formed over some of the plurality of the semiconductor integrated circuits formed over the first substrate, and the second insulating layer is selectively formed over the other of the plurality of the semiconductor integrated circuits formed over the first substrate. Another substrate, which is different from the first substrate, is provided over the first insulating layer and the second insulating layer to separate the first substrate and the other substrate from each other. Accordingly, the semiconductor integrated circuits over which the first insulating layer is formed are not transferred to the other substrate, and the semiconductor integrated circuits over which the second insulating layer is formed are transferred to the other substrate (a first transfer operation). At this time, the semiconductor integrated circuits which are not transferred to the other substrate remain over the first substrate. After the first transfer operation, the semiconductor integrated circuits are transferred to another substrate (a second transfer operation). In this manner, a plurality of the semiconductor integrated circuits formed over the first substrate can be selectively transferred to the other substrate. Accordingly, a plurality of the semiconductor integrated circuits formed over the first substrate can be transferred to the other substrates through multiple transfer operations.

The plurality of the semiconductor integrated circuits formed over the first substrate may have the same configuration or different configurations. For example, the plurality of the semiconductor integrated circuits formed over the first substrate may have the same layout or different layouts.

(A Manufacturing Method 1 of a Semiconductor Device Using a Technique for Transfer Through Four Transfer Operations)

A manufacturing method of a semiconductor device of the present invention includes the step of forming a plurality of first semiconductor integrated circuits, a plurality of second semiconductor integrated circuits each of which is arranged to be adjacent to one of the first semiconductor integrated circuits, a plurality of third semiconductor integrated circuits each of which is arranged to be adjacent to one of the first semiconductor integrated circuits and one of the second semiconductor integrated circuits, and a plurality of fourth semiconductor integrated circuits each of which is arranged to be adjacent to one of the first semiconductor integrated circuits, one of the second semiconductor integrated circuits, and one of the third semiconductor integrated circuits over a first substrate.

A second substrate is adhered so as to cover the first semiconductor integrated circuits to the fourth semiconductor integrated circuits. The first substrate and the second substrate are separated from each other by applying an external force between the first substrate and the second substrate, whereby the first semiconductor integrated circuits are transferred to the second substrate (a first transfer operation).

A first protective layer is formed to cover the first semiconductor integrated circuits and a surface of the second substrate in the periphery of the first semiconductor integrated circuits.

The second substrate and the first protective layer are divided so that the plurality of the first semiconductor integrated circuits is divided into individual pieces and part of the second substrate remains in the periphery of the first semiconductor integrated circuits. Accordingly, a semiconductor device having the first semiconductor integrated circuit is manufactured.

As for the second semiconductor integrated circuits to the fourth semiconductor integrated circuits remaining over the first substrate, the same kind of a transfer operation is repeated, whereby the semiconductor device corresponding to each semiconductor integrated circuit can be manufactured.

In other words, a third substrate is adhered to cover the second semiconductor integrated circuits to the fourth semiconductor integrated circuits remaining over the first substrate. The first substrate and the third substrate are separated from each other by applying an external force between the first substrate and the third substrate, whereby the second semiconductor integrated circuits are transferred to the third substrate (a second transfer operation). A second protective layer is formed to cover the second semiconductor integrated circuits and a surface of the third substrate in the periphery of the second semiconductor integrated circuits. The third substrate and the second protective layer are divided so that the plurality of the second semiconductor integrated circuits is divided into individual pieces and part of the third substrate remains in the periphery of the second semiconductor integrated circuits. In this manner, a semiconductor device having the second semiconductor integrated circuit is manufactured.

A fourth substrate is adhered to cover the third semiconductor integrated circuits and the fourth semiconductor integrated circuits remaining over the first substrate. The first substrate and the fourth substrate are separated from each other by applying an external force between the first substrate and the fourth substrate, whereby the third semiconductor integrated circuits are transferred to the fourth substrate (a third transfer operation). A third protective layer is formed to cover the third semiconductor integrated circuits and a surface of the fourth substrate in the periphery of the third semiconductor integrated circuits. The fourth substrate and the third protective layer are divided so that the plurality of the third semiconductor integrated circuits is divided into individual pieces and part of the fourth substrate remains in the periphery of the third semiconductor integrated circuits. In this manner, a semiconductor device having the third semiconductor integrated circuit is manufactured.

A fifth substrate is adhered to cover the fourth semiconductor integrated circuits remaining over the first substrate. The first substrate and the fifth substrate are separated from each other by applying an external force between the first substrate and the fifth substrate, whereby the fourth semiconductor integrated circuits are transferred to the fifth substrate (a fourth transfer operation). A fourth protective layer is formed to cover the fourth semiconductor integrated circuits and a surface of the fifth substrate in the periphery of the fourth semiconductor integrated circuits. The fifth substrate and the fourth protective layer are divided so that the plurality of the fourth semiconductor integrated circuits is divided into individual pieces and part of the fifth substrate remains in the periphery of the fourth semiconductor integrated circuits. In this manner, a semiconductor device having the fourth semiconductor integrated circuit is manufactured.

(A manufacturing Method 2 of a Semiconductor Device Using a Technique for Transfer Through Four Transfer Operations)

A manufacturing method of a semiconductor device of the present invention includes the step of forming a plurality of first semiconductor integrated circuits, a plurality of second semiconductor integrated circuits each of which is arranged to be adjacent to one of the first semiconductor integrated circuits, a plurality of third semiconductor integrated circuits each of which is arranged to be adjacent to one of the first semiconductor integrated circuits and one of the second semiconductor integrated circuits, and a plurality of fourth semiconductor integrated circuits each of which is arranged to be adjacent to one of the first semiconductor integrated circuits, one of the second semiconductor integrated circuits, and one of the third semiconductor integrated circuits over a first substrate.

A first insulating layer is formed to cover the second semiconductor integrated circuits to the fourth semiconductor integrated circuits. A second insulating layer is formed to cover the first semiconductor integrated circuits. A second substrate is adhered to cover the first insulating layer and the second insulating layer. The first substrate and the second substrate are separated from each other by applying a first external force between the first substrate and the second substrate, whereby the first semiconductor integrated circuits are transferred to the second substrate (a first transfer operation).

A first protective layer is formed to cover the first semiconductor integrated circuits and a surface of the second substrate in the periphery of the first semiconductor integrated circuits. The second substrate and the first protective layer are divided so that the plurality of the first semiconductor integrated circuits is divided into individual pieces and part of the second substrate remains in the periphery of the first semiconductor integrated circuits. In this manner, a semiconductor device having the first semiconductor integrated circuit is manufactured.

A third insulating layer is formed to cover the third semiconductor integrated circuits and the fourth semiconductor integrated circuits remaining over the first substrate. A fourth insulating layer is formed to cover the second semiconductor integrated circuits. A third substrate is adhered to cover the third insulating layer and the fourth insulating layer. The first substrate and the third substrate are separated from each other by applying a second external force between the first substrate and the third substrate, whereby the second semiconductor integrated circuits are transferred to the third substrate (a second transfer operation).

A second protective layer is formed to cover the second semiconductor integrated circuits and a surface of the third substrate in the periphery of the second semiconductor integrated circuits. The third substrate and the second protective layer are divided so that the plurality of the second semiconductor integrated circuits is divided into individual pieces and part of the third substrate remains in the periphery of the second semiconductor integrated circuits. In this manner, a semiconductor device having the second semiconductor integrated circuit is manufactured.

A fifth insulating layer is formed to cover the fourth semiconductor integrated circuits remaining over the first substrate. A sixth insulating layer is formed to cover the third semiconductor integrated circuits. A fourth substrate is adhered to cover the fifth insulating layer and the sixth insulating layer. The first substrate and the fourth substrate are separated from each other by applying a third external force between the first substrate and the fourth substrate, whereby the third semiconductor integrated circuits are transferred to the fourth substrate (a third transfer operation).

A third protective layer is formed to cover the third semiconductor integrated circuits and a surface of the fourth substrate in the periphery of the third semiconductor integrated circuits. The fourth substrate and the third protective layer are divided so that the plurality of the third semiconductor integrated circuits is divided into individual pieces and part of the fourth substrate remains in the periphery of the third semiconductor integrated circuits. In this manner, a semiconductor device having the third semiconductor integrated circuit is manufactured.

A fifth substrate is adhered to cover the fourth semiconductor integrated circuits remaining over the first substrate. The first substrate and the fifth substrate are separated from each other by applying an external force between the first substrate and the fifth substrate, whereby the fourth semiconductor integrated circuits are transferred to the fifth substrate (a fourth transfer operation).

A fourth protective layer is formed to cover the fourth semiconductor integrated circuits and a surface of the fifth substrate in the periphery of the fourth semiconductor integrated circuits. The fifth substrate and the fourth protective layer are divided so that the plurality of the fourth semiconductor integrated circuits is divided into individual pieces and part of the fifth substrate remains in the periphery of the fourth semiconductor integrated circuits. In this manner, a semiconductor device having the fourth semiconductor integrated circuit is manufactured.

The second insulating layer may be formed to cover an edge portion of the first insulating layer or may be formed not to cover the same. The fourth insulating layer may be formed to cover an edge portion of the third insulating layer or may be formed not to cover the same. The sixth insulating layer may be formed to cover an edge portion of the fifth insulating layer or may be formed not to cover the same.

It is to be noted that, after the first semiconductor integrated circuits are transferred to the second substrate, the plurality of the first semiconductor integrated circuits may be further transferred to a sixth substrate, and a first protective layer may be formed to cover the first semiconductor integrated circuits and a surface of the sixth substrate in the periphery of the first semiconductor integrated circuits. Then, the sixth substrate and the first protective layer are divided so that the plurality of the first semiconductor integrated circuits is divided into individual pieces and part of the sixth substrate remains in the periphery of the first semiconductor integrated circuits. In this manner, a semiconductor device having the first semiconductor integrated circuit can be manufactured.

After the second semiconductor integrated circuits are transferred to the third substrate, the plurality of the second semiconductor integrated circuits may be further transferred to a seventh substrate, and a second protective layer may be formed to cover the second semiconductor integrated circuits and a surface of the seventh substrate in the periphery of the second semiconductor integrated circuits. Then, the seventh substrate and the second protective layer are divided so that the plurality of the second semiconductor integrated circuits is divided into individual pieces and part of the seventh substrate remains in the periphery of the second semiconductor integrated circuits. In this manner, a semiconductor device having the second semiconductor integrated circuit can be manufactured.

After the third semiconductor integrated circuits are transferred to the fourth substrate, the plurality of the third semiconductor integrated circuits may be further transferred to an eighth substrate, and a third protective layer may be formed to cover the third semiconductor integrated circuits and a surface of the eighth substrate in the periphery of the third semiconductor integrated circuits. Then, the eighth substrate and the third protective layer are divided so that the plurality of the third semiconductor integrated circuits is divided into individual pieces and part of the eighth substrate remains in the periphery of the third semiconductor integrated circuits.

In this manner, a semiconductor device having the third semiconductor integrated circuit can be manufactured.

After the fourth semiconductor integrated circuits are transferred to the fifth substrate, the plurality of the fourth semiconductor integrated circuits may be further transferred to a ninth substrate, and a fourth protective layer may be formed to cover the fourth semiconductor integrated circuits and a surface of the ninth substrate in the periphery of the fourth semiconductor integrated circuits. Then, the ninth substrate and the fourth protective layer are divided so that the plurality of the fourth semiconductor integrated circuits is divided into individual pieces and part of the ninth substrate remains in the periphery of the fourth semiconductor integrated circuits. In this manner, a semiconductor device having the fourth semiconductor integrated circuit can be manufactured.

It is to be noted that, with respect to the first external force, junction (or adhesive) strength between the second insulating layer and the first semiconductor integrated circuits is made to be higher than junction (or adhesive) strength between the first insulating layer and each of the second semiconductor integrated circuits to the fourth semiconductor integrated circuits, and is made to be higher than junction strength between the first substrate and the first semiconductor integrated circuits. With respect to the first external force, junction strength between the first substrate and each of the second semiconductor integrated circuits to the fourth semiconductor integrated circuits is made to be higher than junction (or adhesive) strength between the first insulating layer and each of the second semiconductor integrated circuits to the fourth semiconductor integrated circuits. With respect to the second external force, junction (or adhesive) strength between the fourth insulating layer and the second semiconductor integrated circuits is made to be higher than junction (or adhesive) strength between the third insulating layer and each of the third semiconductor integrated circuits and the fourth semiconductor integrated circuits, and is made to be higher than junction strength between the first substrate and the second semiconductor integrated circuits. With respect to the second external force, junction strength between the first substrate and each of the third semiconductor integrated circuits and the fourth semiconductor integrated circuits is made to be higher than junction (or adhesive) strength between the third insulating layer and each of the third semiconductor integrated circuits and the fourth semiconductor integrated circuits. With respect to the third external force, junction (or adhesive) strength between the sixth insulating layer and the third semiconductor integrated circuits is made to be higher than junction (or adhesive) strength between the fifth insulating layer and the fourth semiconductor integrated circuits, and is made to be higher than junction strength between the first substrate and the third semiconductor integrated circuits. With respect to the third external force, junction strength between the first substrate and the fourth semiconductor integrated circuits is made to be higher than junction (or adhesive) strength between the fifth insulating layer and the fourth semiconductor integrated circuits. The second insulating layer, the fourth insulating layer, and the sixth insulating layer can be formed using an epoxy-based resin material (a resin material having an epoxy group). The first insulating layer, the third insulating layer, and the fifth insulating layer can be formed using a vinyl-based resin material (a resin material having a vinyl group).

The first semiconductor integrated circuits to the fourth semiconductor integrated circuits can be concurrently formed over the first substrate (formed in the same step). Each of the first semiconductor integrated circuits to the fourth semiconductor integrated circuits may be a circuit having the same configuration or different configurations. For example, at least two of the first semiconductor integrated circuits to the fourth semiconductor integrated circuits may have the same configuration.

Heat resistance of the first substrate can be higher than heat resistance of the second substrate to the ninth substrate. Heat resistance refers to a strain point, a melting point, or a glass transition point.

The manufacturing method of the semiconductor device of the present invention can be a manufacturing method of a semiconductor device having a feature that any of the first semiconductor integrated circuits to the fourth semiconductor integrated circuits is electrically connected to an antenna and data is inputted and outputted by wireless communication through the antenna. The antenna can be formed in forming the first semiconductor integrated circuits to the fourth semiconductor integrated circuits over the first substrate. The antenna may be formed over a substrate which is different from the first substrate.

In the manufacturing method of the semiconductor device of the present invention, after transferring the first semiconductor integrated circuits formed over the first substrate to another substrate, a protective layer is formed to cover the first semiconductor integrated circuits and a surface of the substrate in the periphery of the first semiconductor integrated circuits. Thereafter, the first semiconductor integrated circuits are divided into individual pieces. Over the first substrate, the second semiconductor integrated circuits to the fourth semiconductor integrated circuits are formed in the periphery of the first semiconductor integrated circuits. However, the second semiconductor integrated circuits to the fourth semiconductor integrated circuits are not transferred to the other substrate concurrently with the first semiconductor integrated circuits. Therefore, a structure can be obtained, in which other semiconductor integrated circuits connected to the first semiconductor integrated circuits by an insulating film such as an interlayer insulating film do not exist in the periphery of the first semiconductor integrated circuits over the substrate. Accordingly, a structure can be obtained, in which cross sections of the first semiconductor integrated circuits are covered with the protective layer and the semiconductor integrated circuit is wrapped with the substrate and the protective layer (hereinafter, also referred to as a pouch structure). Thus, an intrusion of an impurity or the like from outside into the semiconductor integrated circuits can be prevented.

Heat resistance of the first substrate is made to be higher than heat resistance of a substrate to which the semiconductor integrated circuits are transferred, whereby an allowable temperature of a process in manufacturing a plurality of semiconductor integrated circuits can be raised. Since sufficient heat treatment can be performed in this manner, characteristics of the semiconductor integrated circuits can be improved.

By forming the second insulating layer so as not to cover an edge portion of the first insulating layer, it is possible for the first insulating layer not to remain between the second insulating layer and the first semiconductor integrated circuits. By forming the fourth insulating layer so as not to cover an edge portion of the third insulating layer, it is possible for the third insulating layer not to remain between the fourth insulating layer and the second semiconductor integrated circuits. By forming the sixth insulating layer so as not to cover an edge portion of the fifth insulating layer, it is possible for the fifth insulating layer not to remain between the sixth insulating layer and the third semiconductor integrated circuits. Accordingly, the adhesion between the second insulating layer and the first semiconductor integrated circuits, the adhesion between the fourth insulating layer and the second semiconductor integrated circuits, and the adhesion between the sixth insulating layer and the third semiconductor integrated circuits can be enhanced, and reliability of the semiconductor device can be further enhanced. In addition, after each of the first semiconductor integrated circuits, the second semiconductor integrated circuits, and the third semiconductor integrated circuits is transferred to other substrates, which are different from the first substrate, the first insulating layer, the third insulating layer, and the fifth insulating layer can be easily removed.

Thus, a manufacturing method of a semiconductor device with high reliability can be provided.

BRIEF DESCRIPTION OF THE DRAWINGS

In the accompanying drawings:

FIGS. 1A and 1B are views showing a structure of Embodiment Mode 1;

FIGS. 11A and 11B are views showing a structure of Embodiment 1.

DETAILED DESCRIPTION OF THE INVENTION

Figure 2A:
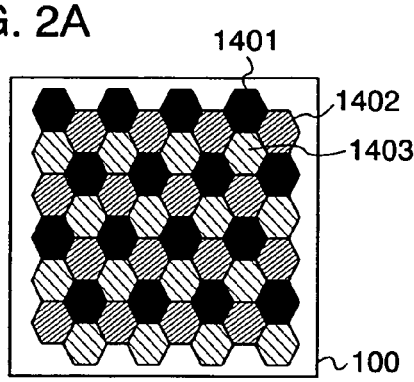
FIGS. 2A and 2B are views showing a structure of Embodiment Mode 2.

Embodiment Modes of the present invention will be explained below with reference to the accompanied drawings. However, the present invention is not limited to the following description, and it is to be easily understood that various changes and modifications will be apparent to those skilled in the art without departing from the scope of the invention. Therefore, it should be noted that the present invention should not be interpreted as being limited to the description of embodiment modes. Note that identical portions or portions having the same function in all figures for explaining embodiment modes are denoted by the same reference numerals. In the present invention, "an object is connected to another object" means that "an object is electrically connected to another object". Therefore, another element and the like may be arranged between the two objects.

EMBODIMENT MODE 1

A manufacturing method of a semiconductor device of the present invention will be explained with reference to FIGS. 1A and 1B, FIGS. 3A to 3F, FIGS. 4A to 4F, FIGS. 5A to 5F, and FIGS. 6A to 6D. A cross-sectional view taken along a line a-a' in FIG. 1A corresponds to FIG. 3A.

Figure 3A:
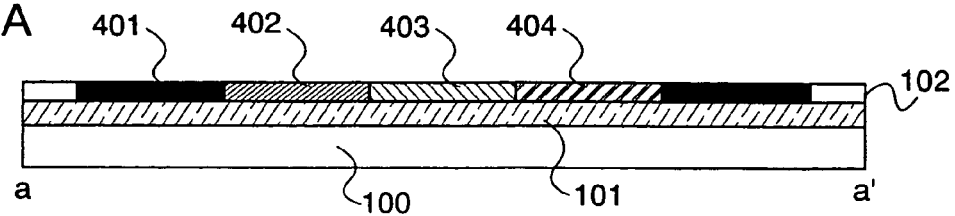
FIGS. 3A to 3F are views showing a structure of Embodiment Mode 1.

As shown in FIG. 3A, a peeling layer 101 is formed over a first substrate 100. First semiconductor integrated circuits 401, second semiconductor integrated circuits 402, third semiconductor integrated circuits 403, and fourth semiconductor integrated circuits 404 are formed over the peeling layer 101. It is to be noted that, as shown in FIG. 1A, the first semiconductor integrated circuits 401 to the fourth semiconductor integrated circuits 404 are formed to be adjacent to each other. The first semiconductor integrated circuits 401 are arranged over the first substrate 100 so as not to align continuously in one direction and a direction orthogonal to the one direction. The second semiconductor integrated circuits 402 are arranged over the first substrate 100 so as not to align continuously in one direction and a direction orthogonal to the one direction. The third semiconductor integrated circuits 403 are arranged over the first substrate 100 so as not to align continuously in one direction and a direction orthogonal to the one direction. The fourth semiconductor integrated circuits 404 are arranged over the first substrate 100 so as not to align continuously in one direction and a direction orthogonal to the one direction. Thus, the first semiconductor integrated circuits 401 to the fourth semiconductor integrated circuits 404 are alternately arranged over the first substrate 100. In FIG. 3A, the first semiconductor integrated circuits 401 to the fourth semiconductor integrated circuits 404 are collectively referred to as a semiconductor integrated circuit layer 102. For example, in FIGS. 1A and 1B, each of the first semiconductor integrated circuits 401 to the fourth semiconductor integrated circuits 404 is arranged in an approximately quadrangular region.

The first semiconductor integrated circuits 401 are transferred to a second substrate. In the same manner, the second semiconductor integrated circuits 402 are transferred to a third substrate. The third semiconductor integrated circuits 403 are transferred to a fourth substrate. The fourth semiconductor integrated circuits 404 are transferred to a fifth substrate. Further, the first semiconductor integrated circuits 401 transferred to the second substrate are transferred to a sixth substrate 501, the second semiconductor integrated circuits 402 transferred to the third substrate are transferred to a seventh substrate 502, the third semiconductor integrated circuits 403 transferred to the fourth substrate are transferred to an eighth substrate 503, and the fourth semiconductor integrated circuits 404 transferred to the fifth substrate are transferred to a ninth substrate 504.

A technique by which the first semiconductor integrated circuits 401 to the fourth semiconductor integrated circuits 404 are transferred to the sixth substrates 501 to the ninth substrate 504, respectively, will be explained in detail with reference to FIG. 1B, FIGS. 3A to 3F, FIGS. 4A to 4F, FIGS. 5A to 5F, and FIGS. 6A to 6D.

As the first substrate 100, a semiconductor substrate such as a silicon wafer, a quartz substrate, a glass substrate, or the like can be used. By using a substrate with a high heat resistance temperature as the first substrate 100, an allowable temperature of a process in manufacturing the first semiconductor integrated circuits 401 to the fourth semiconductor integrated circuits 404 can be raised. Since sufficient heat treatment can be performed in this manner, characteristics of the first semiconductor integrated circuits 401 to the fourth semiconductor integrated circuits 404 can be improved. Further, a substrate with rigidity can also be used as the first substrate 100. By using the substrate with rigidity as the first substrate 100, strain of the first substrate 100 can be decreased, and misalignment or the like in manufacturing the first semiconductor integrated circuits 401 to the fourth semiconductor integrated circuits 404 can be reduced. Accordingly, reliability of the first semiconductor integrated circuits 401 to the fourth semiconductor integrated circuits 404 can be enhanced.

The second semiconductor integrated circuits 402 to the fourth semiconductor integrated circuits 404 are coated with a first resin material.

Figure 3B:
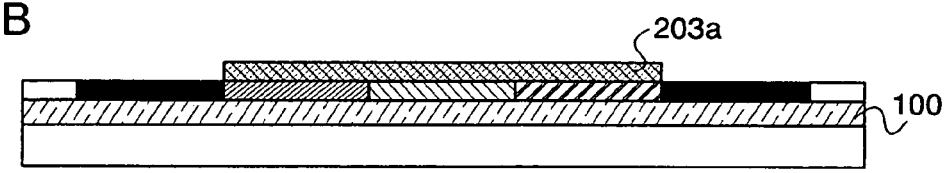

Thereafter, baking treatment is performed using a heating means such as an oven, a hot plate, or a furnace to harden the first resin material, thereby forming a first insulating layer 203a formed from a resin (FIG. 3B). Here, a vinyl-based resin material (a resin material having a vinyl group) is used as the first resin material.

As the first resin material, for example, 503B-SH manufactured by Asahi Chemical Research Laboratory Co., Ltd. can be used. A temperature for the baking treatment is set to be greater than or equal to 130° C. and less than 150° C.

When the temperature for the baking treatment is set to be 130° C., by performing the treatment for ten minutes, the first resin material with which the second semiconductor integrated circuits 402 to the fourth semiconductor integrated circuits 404 are coated can be hardened. It is to be noted that the first insulating layer 203a may have an insulating property with respect to a direction parallel to a surface (a top surface) of the first substrate 100 to prevent short circuit of a plurality of the semiconductor integrated circuits. Therefore, the first insulating layer 203a may be formed using an anisotropic conductive material in substitution for the first resin material. The anisotropic conductive material is a material in which conductive particles are mixed in an adhesive agent. The anisotropic conductive material has a conductive property with respect to a direction perpendicular to the surface of the first substrate 100 and has an insulating property with respect to a direction parallel to the surface of the first substrate 100.

Figure 3C:
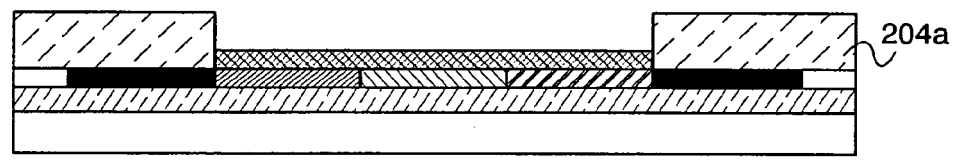

After forming the first insulating layer 203a, the first semiconductor integrated circuits 401 are coated with a second resin material. The second resin material is a material different from the first resin material. Thereafter, baking treatment is performed using a heating means such as an oven, a hot plate, or a furnace to harden the second resin material, thereby forming a second insulating layer 204a formed from a resin (FIG. 3C). Here, an epoxy-based resin material (a resin material having an epoxy group) is used as the second resin material. As the second resin material, for example, XN651 manufactured by Mitsui Chemicals, Inc. can be used. A temperature for the baking treatment is set to be greater than or equal to 140° C. and less than 180° C. When the temperature for the baking treatment is set to be 160° C., by performing the treatment for thirty minutes, the second resin material with which the first semiconductor integrated circuits 401 are coated can be hardened. It is to be noted that the second insulating layer 204a may have an insulating property with respect to a direction parallel to the surface (the top surface) of the first substrate 100 to prevent short circuit of a plurality of the semiconductor integrated circuits. Therefore, the second insulating layer 204a may be formed using an anisotropic conductive material in substitution for the second resin material. The anisotropic conductive material is a material in which conductive particles are mixed in an adhesive agent. The anisotropic conductive material has a conductive property with respect to a direction perpendicular to the surface of the first substrate 100 and has an insulating property with respect to a direction parallel to the surface of the first substrate 100.

A printing method, a droplet discharging method, or the like can be applied as a coating method of the resin material or the like for forming the first insulating layer 203a and the second insulating layer 204a. The droplet discharging method means a method for forming a predetermined pattern by discharging a droplet containing a predetermined composition from a pore. The droplet discharging method is also referred to as an ink-jet method depending on its system. The printing method means a screen printing method or an offset printing method.

In FIGS. 3A to 3F, a structure is shown, in which the first insulating layer 203a and the second insulating layer 204a do not overlap.

Figure 3D:
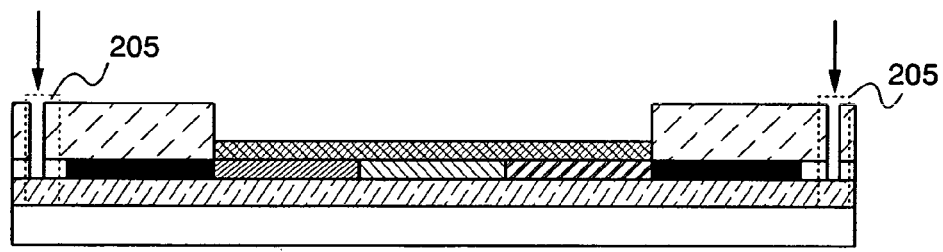

Next, an opening 205 is formed in the semiconductor integrated circuit layer 102, and the peeling layer 101 is exposed (FIG. 3D). It is preferable to provide the opening 205 in a region except for the first semiconductor integrated circuits 401 to the fourth semiconductor integrated circuits 404 included in the semiconductor integrated circuit layer 102, or an edge portion of the first substrate 100. Further, the opening 205 may also be provided in a boundary region between the semiconductor integrated circuits. The opening 205 can be formed by irradiation of a laser beam, ground by a machine, or cut. Forming the opening 205 by laser beam irradiation is preferable because processing time of the step can be shortened. When the opening 205 is provided by laser beam irradiation, by moving a region to be irradiated with the laser beam, a shape of the opening 205 seen from the direction perpendicular to the top surface of the first substrate 100 can be an arbitrary shape. For example, the shape of the opening 205 seen from the direction perpendicular to the top surface of the first substrate 100 can be curved. For example, a UV laser can be used as a laser. The laser beam is emitted to the first substrate 100, the peeling layer 101, the semiconductor integrated circuit layer 102, and the second insulating layer 204a. Also, the laser beam is emitted from the second insulating layer 204a side (a direction indicated by an arrow in FIG. 3D). The opening 205 is formed so that at least part of the peeling layer 101 is exposed. Therefore, the opening 205 is provided in at least the semiconductor integrated circuit layer 102 and the second insulating layer 204a. It is to be noted that the laser beam may reach the first substrate 100. In other words, the opening 205 may be formed so as to penetrate the first substrate 100 or so as to remove part of the first substrate 100.

Figure 3E:
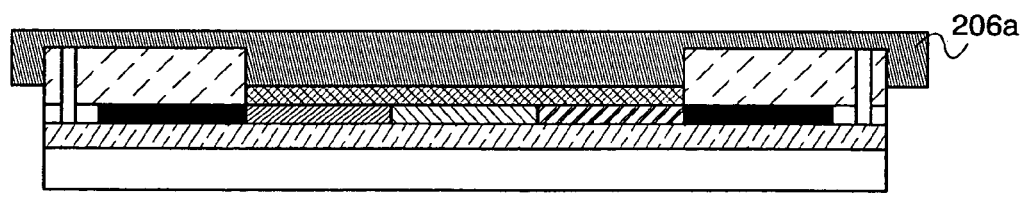

A second substrate 206a is provided over the second insulating layer 204a (FIG. 3E). The second substrate 206a is a substrate in which an insulating layer and an adhesive layer are stacked, and is a thermal peeling substrate. The second substrate 206a is arranged so that the adhesive layer and the second insulating layer 204a are adhered to each other. The thermal peeling substrate has an adhesive layer of which adhesive force is weakened by heat treatment. As the adhesive layer, for example, a layer formed from a thermoplastic adhesive agent which gets soft in heating; a layer formed from a material where a microcapsule that expands by heating or a foaming agent is mixed; a layer formed from a material where a thermal melting property or a pyrolysis property is given to a thermosetting resin; or a layer using a material in which interface strength deteriorates due to penetration of water or using a resin which expands due to absorption of water can be used.

Figure 3F:
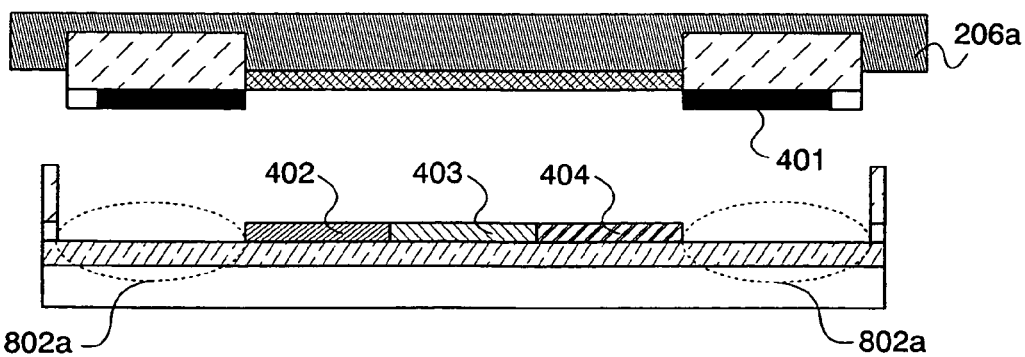

The first semiconductor integrated circuits 401 are peeled from the first substrate 100 using the second substrate 206a. At this time, an external force may be applied so that the second substrate 206a and the first substrate 100 are separated from each other. The first semiconductor integrated circuits 401 may be peeled from the first substrate 100 by etching the peeling layer 101 by introducing a gas or a liquid from the opening 205. Alternatively, the first semiconductor integrated circuits 401 may be peeled from the first substrate 100 by etching part of the peeling layer 101 by introducing a gas or a liquid from the opening 205, and furthermore applying an external force. For etching, for example, a gas or a liquid containing halogen fluoride or an interhalogen compound can be used. The peeling of the first substrate 100 and the first semiconductor integrated circuits 401 are performed inside the peeling layer 101 or at a boundary between the peeling layer 101 and the semiconductor integrated circuit layer 102. In this manner, the first semiconductor integrated circuits 401 are transferred to the second substrate 206a (FIG. 3F). A state of the first substrate 100 after the first semiconductor integrated circuits 401 are transferred to the second substrate 206a is shown in Column X1 and Row a in FIG. 1B.

Figure 4A:
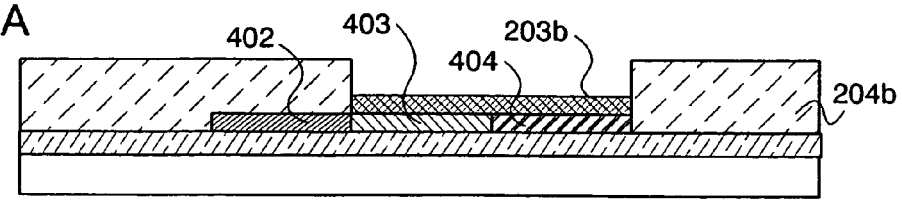
FIGS. 4A to 4F are views showing a structure of Embodiment Mode 1.
Figure 4B:
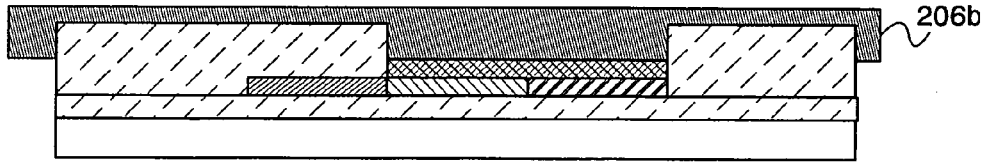
Figure 4C:
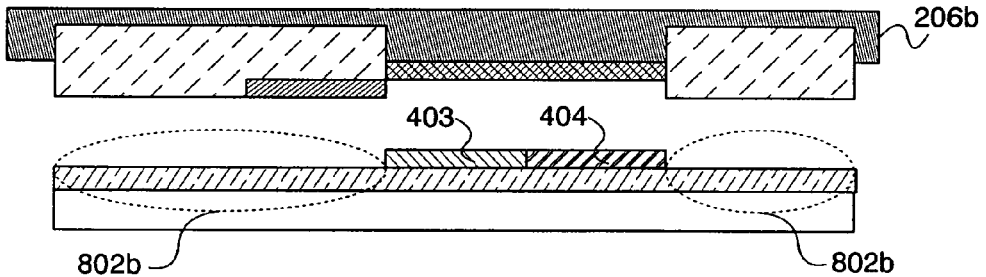

Next, the third semiconductor integrated circuits 403 and the fourth semiconductor integrated circuits 404 remaining over the first substrate 100 are coated with a third resin material, and the third resin material is baked, thereby forming a third insulating layer 203b formed from a resin. After forming the third insulating layer 203b, the second semiconductor integrated circuits 402 are coated with a fourth resin material, then the fourth resin material is baked, thereby forming a fourth insulating layer 204b formed from a resin (FIG. 4A). The third resin material and the first resin material can be the same. The fourth resin material and the second resin material can be the same. Furthermore, as described above, an opening is formed by a laser beam or the like. A third substrate 206b is provided over the third insulating layer 203b and the fourth insulating layer 204b (FIG. 4B). The second semiconductor integrated circuits 402 are peeled from the first substrate 100 using the third substrate 206b. An external force may be applied to separate the third substrate 206b and the first substrate 100 from each other. As the third substrate 206b, the same material as that of the second substrate 206a can be used. In this manner, the second semiconductor integrated circuits 402 are transferred to the third substrate 206b (FIG. 4C). A state of the first substrate 100 after the second semiconductor integrated circuits 402 are transferred to the third substrate 206b is shown in Column X2 and Row a in FIG. 1B.

Figure 4D:
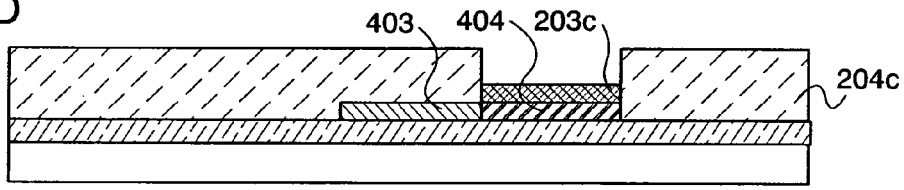
Figure 4E:
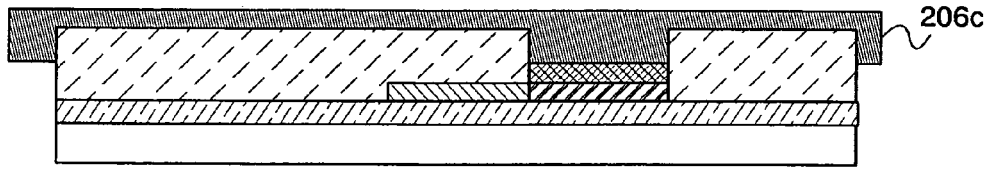
Figure 4F:
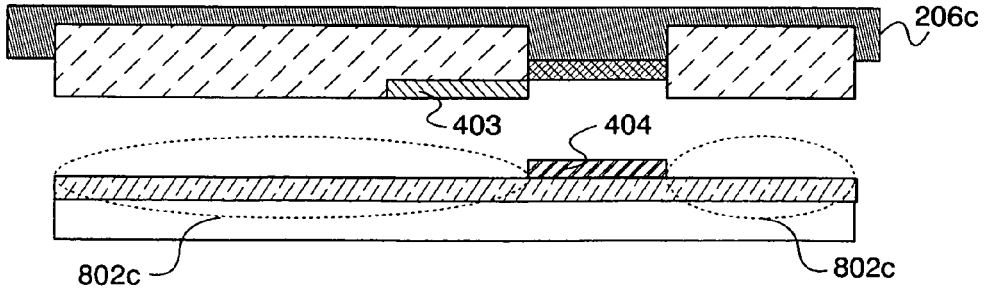

Next, the fourth semiconductor integrated circuits 404 remaining over the first substrate 100 are coated with a fifth resin material, and the fifth resin material is baked, thereby forming a fifth insulating layer 203c formed from a resin. After forming the fifth insulating layer 203c, the third semiconductor integrated circuits 403 are coated with a sixth resin material, then the sixth resin material is baked, thereby forming a sixth insulating layer 204c formed from a resin (FIG. 4D). The fifth resin material can be the same as the first resin material and the third resin material. The sixth resin material can be the same as the second resin material and the fourth resin material. Furthermore, as described above, an opening is formed by a laser beam or the like. A fourth substrate 206c is provided over the fifth insulating layer 203c and the sixth insulating layer 204c (FIG. 4E). The third semiconductor integrated circuits 403 are peeled from the first substrate 100 using the fourth substrate 206c. An external force may be applied to separate the fourth substrate 206c and the first substrate 100 from each other. As the fourth substrate 206c, the same material as that of the second substrate 206a can be used. In this manner, the third semiconductor integrated circuits 403 are transferred to the fourth substrate 206c (FIG. 4F). A state of the first substrate 100 after the third semiconductor integrated circuits 403 are transferred to the fourth substrate 206c is shown in Column X3 and Row a in FIG 1B.

Figure 5A:
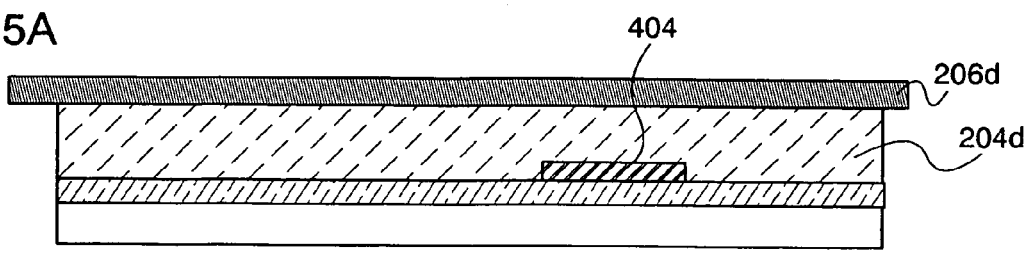
FIGS. 5A to 5F are views showing a structure of Embodiment Mode 1.
Figure 5B:
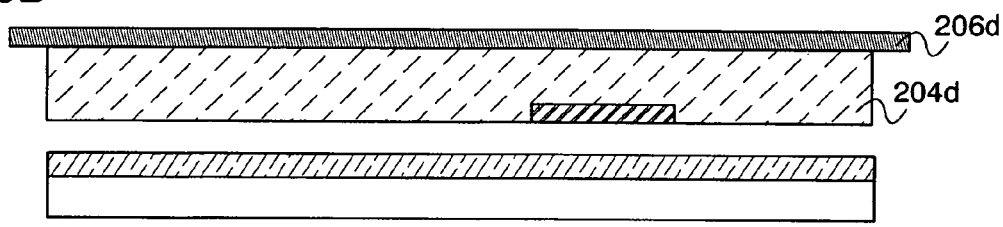
Figure 5C:
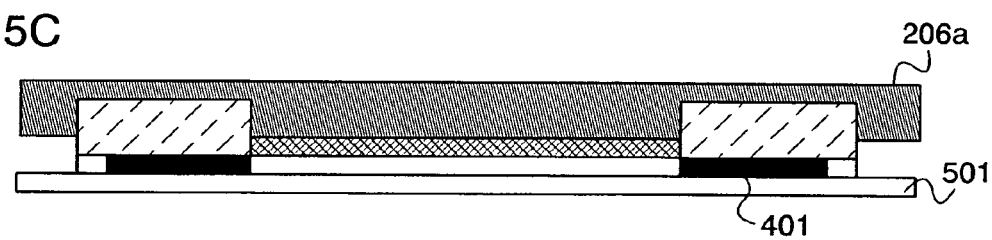
Figure 5D:
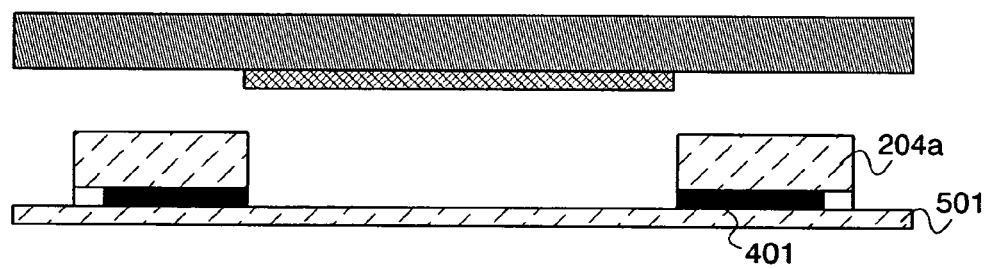
Figure 5E:
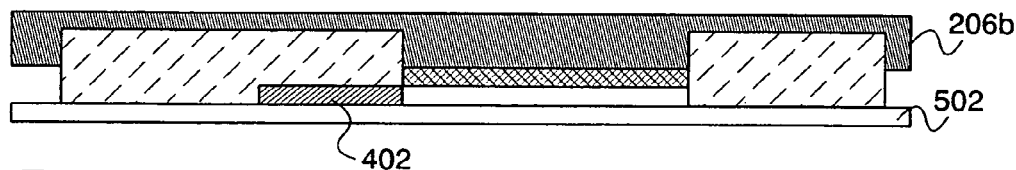

Next, the fourth semiconductor integrated circuits 404 remaining over the first substrate 100 are coated with a seventh resin material, and the seventh resin material is baked, thereby forming a seventh insulating layer 204d formed from a resin. The seventh resin material and the second resin material can be the same. Furthermore, as described above, an opening is formed by a laser beam or the like. A fifth substrate 206d is provided over the seventh insulating layer 204d (FIG. 5A). By separating the first substrate 100 and the fifth substrate 206d from each other by applying an external force, that is, by using a physical means, the fourth semiconductor integrated circuits 404 are peeled from the first substrate 100. As the fifth substrate 206d, the same material as that of the second substrate 206a can be used. Accordingly, the fourth semiconductor integrated circuits 404 are transferred to the fifth substrate 206d (FIG 5B). Even when the seventh insulating layer 204d is not formed, the fourth semiconductor integrated circuits 404 can be peeled using the fifth substrate 206d which adheres to the fourth semiconductor integrated circuits 404. A state of the first substrate 100 after the fourth semiconductor integrated circuits 404 are transferred to the fifth substrate 206d is shown in Column X4 and Row a in FIG. 1B.

In a step shown in FIG. 3F, in a case where peeling is performed inside the peeling layer 101, a surface of a region 802a of the peeling layer 101, which had overlapped with the first semiconductor integrated circuits 401, is removed. In this case, when the fourth insulating layer 204b is formed over the region 802a in a step shown in FIG. 4A, it may be difficult to peel the fourth insulating layer 204b from the first substrate 100 in a step shown in FIG. 4B. Thus, after the step shown in FIG. 3F, treatment for weakening adhesion to the fourth insulating layer 204b is performed with respect to the region 802a. As this treatment, a layer which forms a surface of the peeling layer 101 removed in the step shown in FIG. 3F may be manufactured again. Alternatively, instead of performing the treatment for weakening adhesion, after the step shown in FIG. 3F, the fourth insulating layer 204b may be formed only in a portion except for the region 802a in the step shown in FIG. 4A. In the same manner, the treatment for weakening adhesion may be performed with respect to the region 802b shown in FIG. 4C, or the sixth insulating layer 204c may be formed only in a portion except for the region 802b. The treatment for weakening adhesion may be performed with respect to the region 802c shown in FIG. 4F, or the seventh insulating layer 204d may be formed only in a portion except for the region 802c.

Figure 5F:
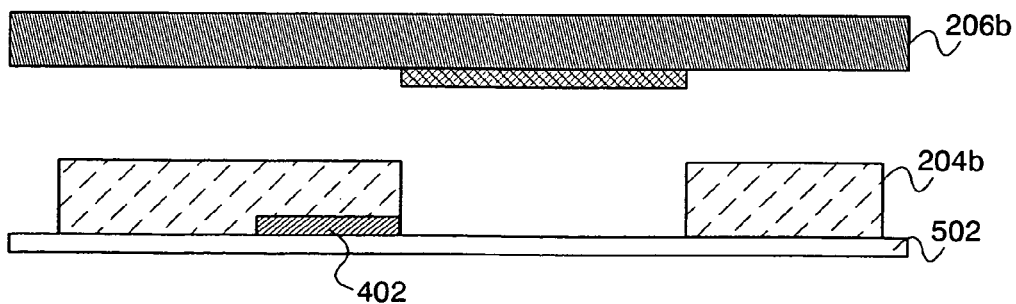
Figure 6A:
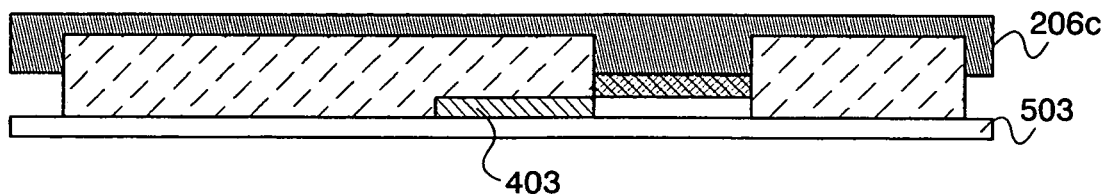
FIGS. 6A to 6D are views showing a structure of Embodiment Mode 1.
Figure 6B:
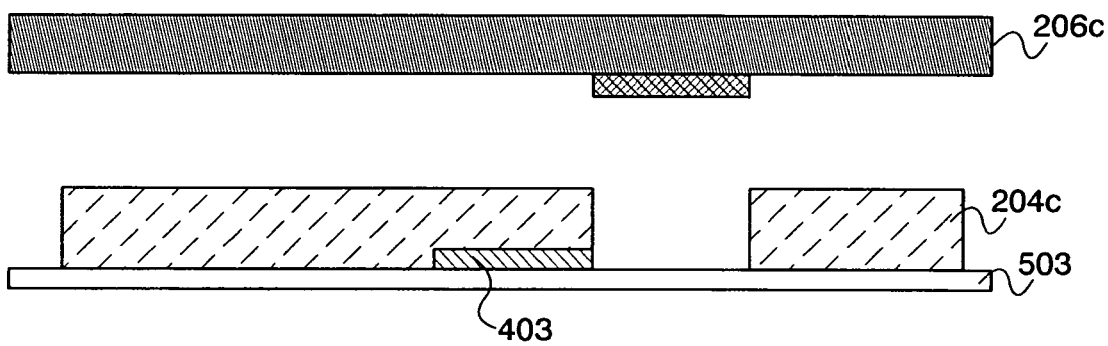
Figure 6C:
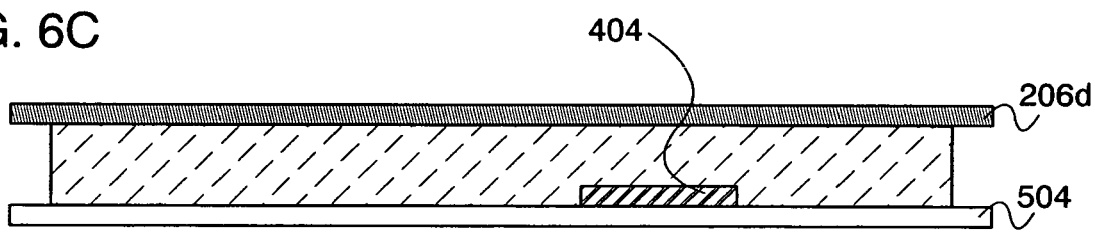
Figure 6D:
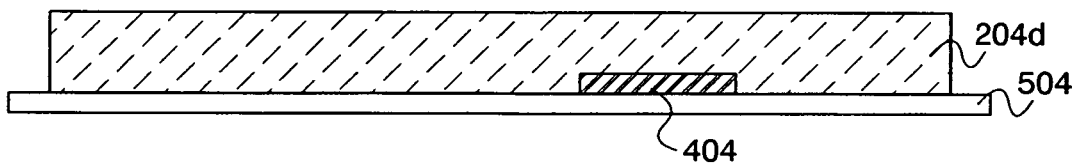

Subsequently, a sixth substrate 501 is provided over a surface of the first semiconductor integrated circuits 401 (FIG SC) transferred to the second substrate 206a in the step of FIG. 3F and heat treatment is performed, and then, the first semiconductor integrated circuits 401 are peeled from the second substrate 206a and the first semiconductor integrated circuits 401 are transferred to the sixth substrate 501 (FIG SD). A state of the sixth substrate 501 at this time is shown in Column X1 and Row b in FIG. 1B. In the same manner, a seventh substrate 502 is provided over a surface of the second semiconductor integrated circuits 402 (FIG. SE) transferred to the third substrate 206b in the step of FIG. 4C, and the second semiconductor integrated circuits 402 are peeled from the third substrate 206b and the second semiconductor integrated circuits 402 are transferred to the seventh substrate 502 (FIG. 5F). A state of the seventh substrate 502 at this time is shown in Column X2 and Row b in FIG. 1B. An eighth substrate 503 is provided over a surface of the third semiconductor integrated circuits 403 (FIG. 6A) transferred to the fourth substrate 206c in the step of FIG. 4F, and the third semiconductor integrated circuits 403 are peeled from the fourth substrate 206c and the third semiconductor integrated circuits 403 are transferred to the eighth substrate 503 (FIG. 6B). A state of the eighth substrate 503 at this time is shown in Column X3 and Row b in FIG. 1B. A ninth substrate 504 is provided over a surface of the fourth semiconductor integrated circuits 404 (FIG. 6C) transferred to the fifth substrate 206d in the step of FIG. 5B, and the fourth semiconductor integrated circuits 404 are peeled from the fifth substrate 206d and the fourth semiconductor integrated circuits 404 are transferred to the ninth substrate 504 (FIG. 6D). A state of the ninth substrate 504 at this time is shown in Column X4 and Row b in FIG. 1B. Each of the sixth substrate 501 to the ninth substrate 504 is a substrate in which an insulating layer and an adhesive layer are stacked. The adhesive layer is a layer in which adhesive force is increased by heat treatment, and corresponds to a layer including a thermoplastic resin. The thermoplastic resin corresponds to, for example, polyethylene, polystyrene, polypropylene, polyvinyl chloride, or the like.

As shown in the Row b FIG. 1B, there is no circuit (the second semiconductor integrated circuits 402 to the fourth semiconductor integrated circuits 404) adjacent to the first semiconductor integrated circuits 401 over the sixth substrate 501, and accordingly, the first semiconductor integrated circuits 401 are arranged while keeping a distance from each other. There is no circuit (the first semiconductor integrated circuits 401, the third semiconductor integrated circuits 403, and the fourth semiconductor integrated circuits 404) adjacent to the second semiconductor integrated circuits 402 over the seventh substrate 502, and accordingly, the second semiconductor integrated circuits 402 are arranged while keeping a distance from each other. There is no circuit (the first semiconductor integrated circuits 401, the second semiconductor integrated circuits 402, and the fourth semiconductor integrated circuits 404) adjacent to the third semiconductor integrated circuits 403 over the eighth substrate 503, and accordingly, the third semiconductor integrated circuits 403 are arranged while keeping a distance from each other. There is no circuit (the first semiconductor integrated circuits 401 to the third semiconductor integrated circuits 403) adjacent to the fourth semiconductor integrated circuits 404 over the ninth substrate 504, and accordingly, the fourth semiconductor integrated circuits 404 are arranged while keeping a distance from each other.

A first protective layer 505 is formed to cover the first semiconductor integrated circuits 401 and a surface of the sixth substrate 501 in the periphery of the first semiconductor integrated circuits 401. Then, the sixth substrate 501 and the first protective layer 505 are divided so that the plurality of the first semiconductor integrated circuits 401 is divided into individual pieces and part of the sixth substrate 501 remains in the periphery of the first semiconductor integrated circuits 401. The division is performed along a line 213 passing approximately midway between the plurality of the first semiconductor integrated circuits 401 (refer to Column X1 and Row c in FIG. 1B). It is to be noted that a location for the division is not limited to the line 213, and division may be performed at another location as long as the first semiconductor integrated circuits 401 are not cut. In this manner, a semiconductor device having the first semiconductor integrated circuit 401 shown in Column X1 and Row d in FIG. 1B can be manufactured.

A second protective layer 506 is formed to cover the second semiconductor integrated circuits 402 and a surface of the seventh substrate 502 in the periphery of the second semiconductor integrated circuits 402. Then, the seventh substrate 502 and the second protective layer 506 are divided so that the plurality of the second semiconductor integrated circuits 402 is divided into individual pieces and part of the seventh substrate 502 remains in the periphery of the second semiconductor integrated circuits 402. The division is performed along a line 214 passing approximately midway between the plurality of the second semiconductor integrated circuits 402 (refer to Column X2 and Row c in FIG. 1B). It is to be noted that a location for the division is not limited to the line 214, and division may be performed at another location as long as the second semiconductor integrated circuits 402 are not cut. In this manner, a semiconductor device having the second semiconductor integrated circuit 402 shown in Column X2 and Row d in FIG. 1B can be manufactured.

A third protective layer 507 is formed to cover the third semiconductor integrated circuits 403 and a surface of the eighth substrate 503 in the periphery of the third semiconductor integrated circuits 403. Then, the eighth substrate 503 and the third protective layer 507 are divided so that the plurality of the third semiconductor integrated circuits 403 is divided into individual pieces and part of the eighth substrate 503 remains in the periphery of the third semiconductor integrated circuits 403. The division is performed along a line 215 passing approximately midway between the plurality of the third semiconductor integrated circuits 403 (refer to Column X3 and Row c in FIG. 1B). It is to be noted that a location for the division is not limited to the line 215, and division may be performed at another location as long as the third semiconductor integrated circuits 403 are not cut. In this manner, a semiconductor device having the third semiconductor integrated circuit 403 shown in Column X3 and row d in FIG. 1B can be manufactured.

A fourth protective layer 508 is formed to cover the fourth semiconductor integrated circuits 404 and a surface of the ninth substrate 504 in the periphery of the fourth semiconductor integrated circuits 404. Then, the ninth substrate 504 and the fourth protective layer 508 are divided so that the plurality of the fourth semiconductor integrated circuits 404 is divided into individual pieces and part of the ninth substrate 504 remains in the periphery of the fourth semiconductor integrated circuits 404. The division is performed along a line 216 passing approximately midway between the plurality of the fourth semiconductor integrated circuits 404 (refer to column X4 and row c in FIG. 1B). It is to be noted that a location for the division is not limited to the line 216, and division may be performed at another location as long as the fourth semiconductor integrated circuits 404 are not cut. In this manner, a semiconductor device having the fourth semiconductor integrated circuit 404 shown in column X4 and row d in FIG. 1B can be manufactured.

Division of the sixth substrate 501 and the first protective layer 505, division of the seventh substrate 502 and the second protective layer 506, division of the eighth substrate 503 and the third protective layer 507, and division of the ninth substrate 504 and the fourth protective layer 508 can be performed with a laser, a cutter, a pair of scissors, or the like. In addition, division of the substrate and the protective layer may be performed with a heated wire or the like. For example, the substrate and the protective layer may be divided by being pushed and cut with a frame of a heated wire having a shape into which the semiconductor integrated circuits are divided. It is to be noted that, the sixth substrate 501 and the first protective layer 505, the seventh substrate 502 and the second protective layer 506, the eighth substrate 503 and the third protective layer 507, and the ninth substrate 504 and the fourth protective layer 508 may not be divided completely, and a perforated line may be put therein along the lines 213 to 216. Accordingly, by a user of the semiconductor device according to need, a semiconductor device can be divided into individual pieces and used.

In the semiconductor device obtained in this manner, a structure can be obtained, in which the sixth substrate 501 and the first protective layer 505 are in contact with each other in a region 555 in the periphery of the first semiconductor integrated circuits 401. In the same manner, a structure can be obtained, in which the seventh substrate 502 and the second protective layer 506 are in contact with each other in a region in the periphery of the second semiconductor integrated circuits 402. A structure can be obtained, in which the eighth substrate 503 and the third protective layer 507 are in contact with each other in a region in the periphery of the third semiconductor integrated circuits 403. A structure can be obtained, in which the ninth substrate 504 and the fourth protective layer 508 are in contact with each other in a region in the periphery of the fourth semiconductor integrated circuits 404. Thus, a semiconductor device having a structure in which a semiconductor integrated circuit is wrapped with a substrate and a protective layer (a pouch structure) can be obtained. Accordingly, an intrusion of an impurity or the like from outside into the semiconductor integrated circuit can be further prevented, and reliability of the semiconductor device can be further enhanced.

It is to be noted that, in the pouch structure, the substrate and the protective layer with which the semiconductor integrated circuit is wrapped (with which the entire semiconductor integrated circuit is surrounded) may be formed using the same material or the different material. By forming the substrate and the protective layer with which the semiconductor integrated circuit is wrapped using the same material, adhesion between the substrate and the protective layer can be increased. Accordingly, an intrusion of an impurity or the like from outside into the semiconductor integrated circuits can be further prevented, and reliability of the semiconductor device can be further enhanced. In addition, by forming the substrate and the protective layer with which the semiconductor integrated circuit is wrapped using the same material, an external force given to the semiconductor integrated circuit by the substrate and the protective layer can be relieved. Thus, the external force given to the semiconductor integrated circuit can be relieved, and reliability of the semiconductor device can be further enhanced. The substrate and the protective layer with which the semiconductor integrated circuit is wrapped may be formed using, for example, polyethylene terephthalate, polyethersulfone, polyethylene naphthalate, polycarbonate, nylon, polyetheretherketone, polysulfone, polyetherimide, polyarylate, polybutylene terephthalate, or polyimide. If a flexible substrate is used for the substrate and the protective layer with which the semiconductor integrated circuit is wrapped, a flexible semiconductor device can be manufactured. A plastic substrate can be used as the flexible substrate. Alternatively, a glass substrate or a substrate which is formed by polishing a semiconductor substrate to be thinned may be used. For example, in a single crystal silicon substrate having a surface perpendicular to a crystal axis <100>or <110> of single crystal silicon, which is polished to have a thickness greater than 0.1 μm and less than or equal to 20 μm, typically greater than or equal to 1 μm and less than or equal to 5 μm, can be used.

The substrate and the protective layer with which the semiconductor integrated circuit is wrapped may be colored. Accordingly, a shape of the semiconductor integrated circuit can be hidden, whereby secret can be protected. Further, light entering the semiconductor integrated circuit can be shielded, whereby the semiconductor integrated circuit can be prevented from deterioration due to light, or the like.

It is preferable that a step of wrapping the semiconductor integrated circuit, namely a step of providing the substrate and the protective layer with which the semiconductor integrated circuit is wrapped to be in contact with the semiconductor integrated circuit be performed in a dried nitrogen atmosphere. Thus, oxygen or moisture can be prevented from entering between the substrate and the protective layer with which the semiconductor integrated circuit is wrapped, and the semiconductor integrated circuit, whereby reliability of a semiconductor device can be enhanced.

By forming the second insulating layer 204a so as not to cover an edge portion of the first insulating layer 203a, it is possible for the first insulating layer 203a not to remain between the second insulating layer 204a and the first semiconductor integrated circuits 401. By forming the fourth insulating layer 204b so as not to cover an edge portion of the third insulating layer 203b, it is possible for the third insulating layer 203b not to remain between the fourth insulating layer 204b and the second semiconductor integrated circuits 402. By forming the sixth insulating layer 204c so as not to cover an edge portion of the fifth insulating layer 203c, it is possible for the fifth insulating layer 203c not to remain between the sixth insulating layer 204c and the third semiconductor integrated circuits 403. Accordingly, the adhesion between the second insulating layer 204a and the first semiconductor integrated circuits 401, the adhesion between the fourth insulating layer 204b and the second semiconductor integrated circuits 402, and the adhesion between the sixth insulating layer 204c and the third semiconductor integrated circuits 403 can be enhanced, and reliability of the semiconductor device can be further enhanced. In addition, after the first semiconductor integrated circuits 401, the second semiconductor integrated circuits 402, and the third semiconductor integrated circuits 403 are transferred to the substrates, which are different from the first substrate 100, the first insulating layer 203a, the third insulating layer 203b, and the fifth insulating layer 203c can be easily removed.

In this embodiment mode, the structure in shown, in which after the first semiconductor integrated circuits 401 transferred to the second substrate 206a are transferred to the sixth substrate 501, the first protective layer 505 is formed over the sixth substrate 501, and the sixth substrate 501 and the first protective layer 505 are divided. However, the present invention is not limited thereto. A structure may also be employed, in which after the first semiconductor integrated circuits 401 are transferred to the second substrate 206a, the first protective layer 505 is formed over the second substrate 206a, and the second substrate 206a and the first protective layer 505 are divided so that the first semiconductor integrated circuits 401 are divided into individual pieces. In the same manner, a structure may also be employed, in which after the second semiconductor integrated circuits 402 are transferred to the third substrate 206b, the second protective layer 506 is formed over the third substrate 206b, and the third substrate 206b and the second protective layer 506 are divided so that the second semiconductor integrated circuits 402 are divided into individual pieces. In the same manner, a structure may also be employed, in which after the third semiconductor integrated circuits 403 are transferred to the fourth substrate 206c, the third protective layer 507 is formed over the fourth substrate 206c, and the fourth substrate 206c and the third protective layer 507 are divided so that the third semiconductor integrated circuits 403 are divided into individual pieces. In the same manner, a structure may also be employed, in which after the fourth semiconductor integrated circuits 404 are transferred to the fifth substrate 206d, the fourth protective layer 508 is formed over the fifth substrate 206d, and the fifth substrate 206d and the fourth protective layer 508 are divided so that the fourth semiconductor integrated circuits 404 are divided into individual pieces. Accordingly, a plurality of semiconductor devices is manufactured. If each of the second substrate 206a to the fifth substrate 206d is a flexible substrate at this time, a semiconductor device having flexibility can be manufactured.

In this embodiment mode, a structure is shown, in which after the substrate and the protective layer are attached to each other to surround the semiconductor integrated circuits, a plurality of the semiconductor integrated circuits is divided into individual pieces. However, the present invention is not limited thereto. After the semiconductor integrated circuits are transferred to a substrate, which is different from the first substrate 100, the plurality of the semiconductor integrated circuits may be divided to be separated into individual pieces, and then, a protective layer may be formed to obtain a pouch structure.

Although the structure is shown in this embodiment mode, in which division is performed so that the semiconductor integrated circuits are divided to be separated into individual pieces, the present invention is not limited thereto. The division may also be performed so that the semiconductor integrated circuits may be divided into groups each including a plurality of the semiconductor integrated circuits in accordance with an intended purpose of the semiconductor device. For example, a division may be performed into a shape in which a plurality of the semiconductor integrated circuits is aligned while keeping a distance from each other. Since the plurality of the semiconductor integrated circuits is connected by a substrate in a structure in which division is performed so that the plurality of the semiconductor integrated circuits is aligned, it is possible to easily manufacture a semiconductor device having a structure in which the plurality of the semiconductor integrated circuits is electrically connected to each other in series or in parallel. Also, the plurality of the semiconductor integrated circuits may be shipped with a state of being connected by a substrate, and thereafter, the plurality of the semiconductor integrated circuits may be further divided into individual pieces to be used. In the state where the plurality of the semiconductor integrated circuits is connected to each other by the substrate, connection of the plurality of the semiconductor integrated circuits, a plurality of elements, or the like can be collectively performed. For example, connection of the plurality of the semiconductor integrated circuits, the plurality of elements, or the like can be performed using a roll-to-roll method. Therefore, efficiency of mass production of the semiconductor device can be improved.

Thus, a manufacturing method of a semiconductor device with high reliability can be provided.

EMBODIMENT MODE 2

Figure 2B:
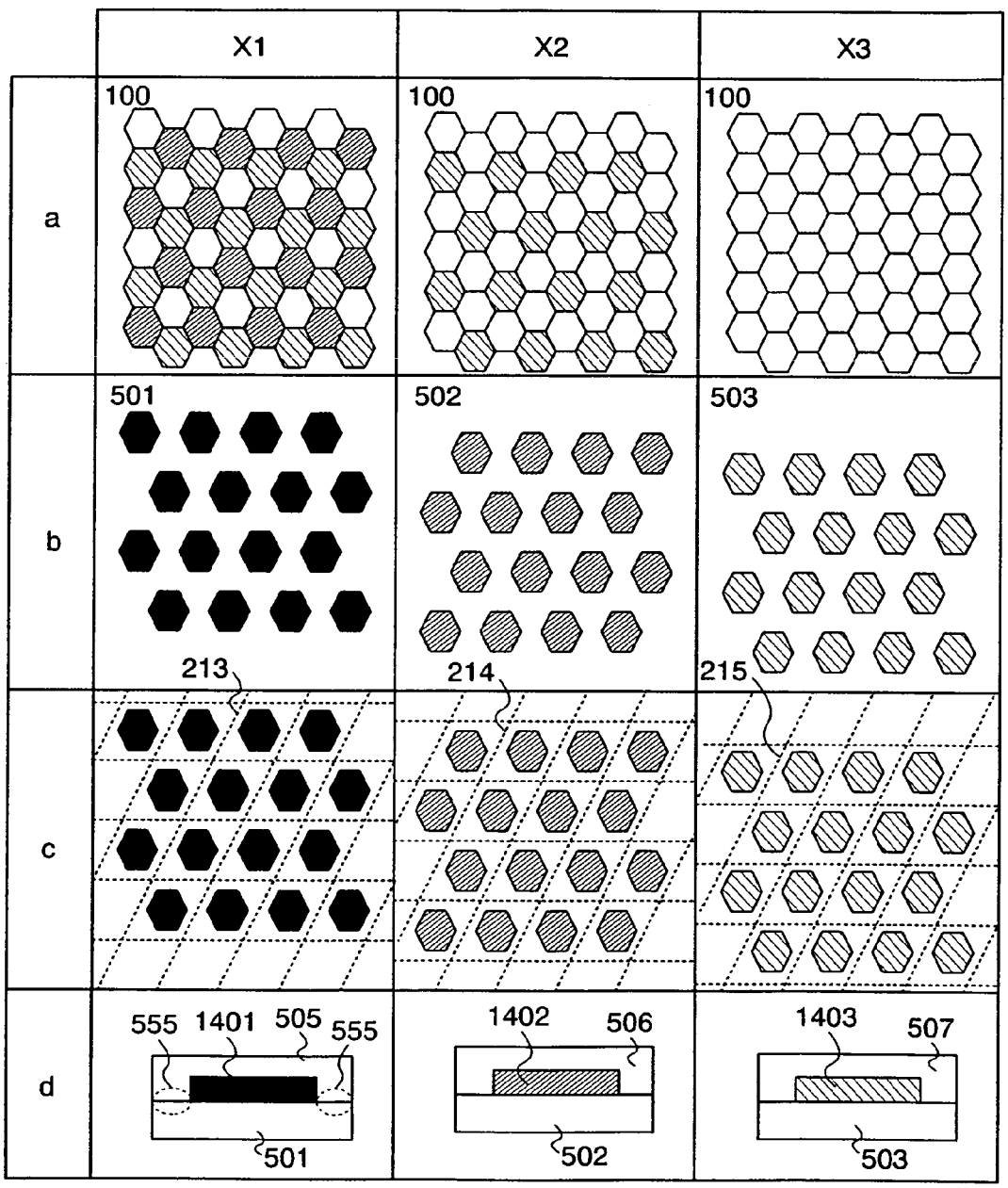

In this embodiment mode, a manufacturing method of a semiconductor device having a pouch structure using a technique for transfer through three transfer operations will be explained with reference to FIGS. 2A and 2B. It is to be noted that the same portions as in Embodiment Mode 1 are denoted by the same reference numerals.

A peeling layer 101 is formed over a first substrate 100. As shown in FIG. 2A, first semiconductor integrated circuits 1401, second semiconductor integrated circuits 1402, and third semiconductor integrated circuits 1403 are formed over the peeling layer 101. The first semiconductor integrated circuits 1401 to the third semiconductor integrated circuits 1403 are formed over the first substrate 100 in an alternating manner. The first semiconductor integrated circuits 1401 are arranged over the first substrate 100 so as not to align continuously in one direction and a direction orthogonal to the one direction. The second semiconductor integrated circuits 1402 are arranged over the first substrate 100 so as not to align continuously in one direction and a direction orthogonal to the one direction. The third semiconductor integrated circuits 1403 are arranged over the first substrate 100 so as not to align continuously in one direction and a direction orthogonal to the one direction. Thus, the first semiconductor integrated circuits 1401 to the third semiconductor integrated circuits 1403 are alternately arranged over the first substrate 100. For example, in FIGS. 2A and 2B, each of the first semiconductor integrated circuits 1401 to the third semiconductor integrated circuits 1403 is arranged in an approximately hexagonal region.

The first semiconductor integrated circuits 1401 are transferred to a second substrate 206a. In the same manner, the second semiconductor integrated circuits 1402 are transferred to a third substrate 206b. The third semiconductor integrated circuits 1403 are transferred to a fourth substrate 206c. Further, the first semiconductor integrated circuits 1401 transferred to the second substrate 206a are transferred to a sixth substrate 501, the second semiconductor integrated circuits 1402 transferred to the third substrate 206b are transferred to a seventh substrate 502, and the third semiconductor integrated circuits 1403 transferred to the fourth substrate 206c are transferred to an eighth substrate 503.

A technique by which the first semiconductor integrated circuits 1401 to the third semiconductor integrated circuits 1403 are transferred to the sixth substrate 501 to the eighth substrate 503 is the same as the method explained in Embodiment Mode 1 with reference to FIGS. 1A and 1B, FIGS. 3A to 3F, FIGS. 4A to 4F, FIGS. 5A to 5F, and FIGS. 6A to 6D. Therefore, the explanation will be omitted.

The semiconductor device obtained in this manner can have a pouch structure. Accordingly, an intrusion of an impurity or the like from outside into the semiconductor integrated circuit can be further prevented, and reliability of the semiconductor device can be further enhanced.

In this embodiment mode, a technique for manufacturing a semiconductor device having a pouch structure using a technique for transfer through three transfer operations is explained. However, the present invention is not limited thereto. By changing a shape of a semiconductor integrated circuit, the number of transfer operations or the number of semiconductor devices which can be formed from one first substrate 100 can be changed. For example, the present invention can be applied in a case of forming a plurality of first semiconductor integrated circuits and a plurality of at least one kind of other semiconductor integrated circuits arranged to surround the first semiconductor integrated circuit over a first substrate. In this case, a second substrate is adhered to cover the first semiconductor integrated circuits and the other semiconductor integrated circuits. The first substrate and the second substrate are separated from each other by applying an external force between the first substrate and the second substrate, whereby the first semiconductor integrated circuits are transferred to the second substrate. A protective layer is formed to cover the first semiconductor integrated circuits and a surface of the second substrate in the periphery of the first semiconductor integrated circuits. The second substrate and the protective layer are divided so that the plurality of the first semiconductor integrated circuits is divided into individual pieces and part of the second substrate remains in the periphery of the first semiconductor integrated circuits.

Accordingly, a manufacturing method of a semiconductor device with high reliability can be provided.

This embodiment can be implemented by being freely combined with Embodiment Mode 1.

EMBODIMENT MODE 3

In this embodiment mode, a method for forming semiconductor integrated circuits over a first substrate 100 will be explained with reference to FIGS. 7A to 7D and FIGS. 8A and 8B.

Figure 7A:
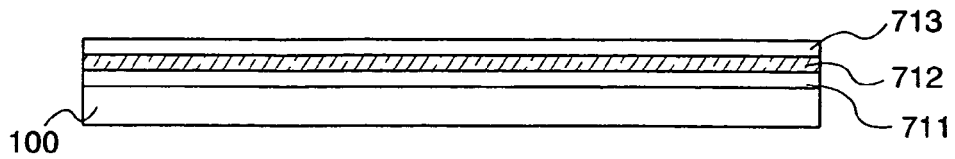
FIGS. 7A to 7D are views showing a structure of Embodiment Mode 3.

As shown in FIG. 7A, an insulating layer 711, a peeling layer 712, and an insulating layer 713 are formed over the first substrate 100. As the first substrate 100, a glass substrate such as a barium borosilicate glass substrate or an alumino borosilicate glass substrate, a quartz substrate, a ceramic substrate, or the like can be used. Moreover, a semiconductor substrate over which an insulating film is formed may be used as well. A substrate formed from a synthetic resin having flexibility such as plastic may also be used. The surface of the first substrate 100 may be planarized by being polished by a CMP (chemical mechanical polishing) method or the like. As the insulating layer 711 and the insulating layer 713, oxide of silicon, nitride of silicon, oxide of silicon containing nitrogen, nitride of silicon containing oxygen, or the like that is formed by a chemical vapor deposition method (CVD method) or a sputtering method can be used. As the peeling layer 712, a layer containing an element selected from W, Mo, Ti, Ta, Nb, Ni, Co, Zr, Zn, Ru, Rh, Pd, Os, Ir, Si, or the like, an alloy or a compound material containing the element as its main component is formed as a single layer or a stacked layer by a sputtering method or the like. It is to be noted that a layer containing silicon may be any of amorphous, microcrystalline, and polycrystalline.

When the peeling layer 712 has a single layer structure, preferably, a layer containing any of W, Mo, a mixture of W and Mo, oxide of W, oxynitride of W, oxide of Mo, oxynitride of Mo, oxide of a mixture of W and Mo, and oxynitride of a mixture of W and Mo can be used.

When the peeling layer 712 has a stacked layer structure including two layers, preferably, a layer containing any of W, Mo, and a mixture of W and Mo can be used as a first layer, and a layer containing any of oxide of W, oxynitride of W, oxide of Mo, oxynitride of Mo, oxide of a mixture of W and Mo, and oxynitride of a mixture of W and Mo can be used as a second layer. The surface of the first layer is processed by oxygen plasma treatment or $N_2O$ plasma treatment, whereby these oxide or oxynitride can be formed.

Figure 7B:
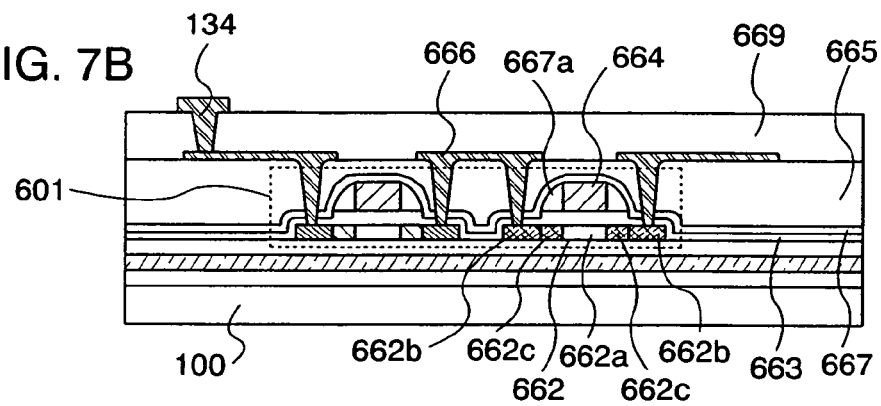

Next, as shown in FIG. 7B, a semiconductor layer 662 is formed over the insulating layer 713, and an element group 601 is formed.

As the semiconductor layer 662, an island-like crystalline semiconductor film or amorphous semiconductor film can be used. In addition, an organic semiconductor film may also be used. The crystalline semiconductor film can be obtained by crystallizing the amorphous semiconductor film. As a crystallization method, a laser crystallization method, a thermal crystallization method using RTA or furnace annealing, a thermal crystallization method using a crystallization-promoting metal element, or the like can be used. The semiconductor layer 662 has a channel formation region 662a and a pair of impurity regions 662b to which an impurity element imparting a conductivity type is added. Although a structure is shown, in which each of low concentration impurity regions 662c to which the impurity element is added at lower concentration than the impurity regions 662b is included between the channel formation region 662a and one of the pair of the impurity regions 662b and between the channel formation region 662a and the other of the pair of the impurity regions 662b, the present invention is not limited thereto. A structure may also be employed, in which the low concentration impurity regions 662c are not provided. In addition, a structure may also be employed, in which silicide is formed over part of a top surface of the pair of the impurity regions 662b (especially, a portion which is in contact with a wiring 666) or an entire surface thereof.

Figure 8A:
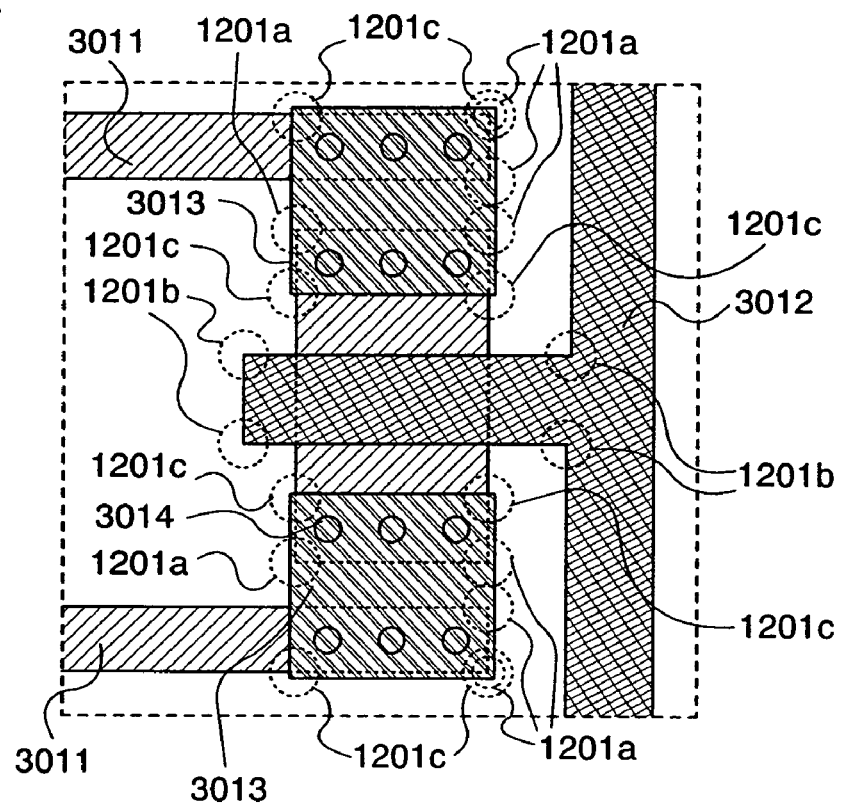
FIGS. 8A and 8B are views showing a structure of Embodiment Mode 3.
Figure 8B:
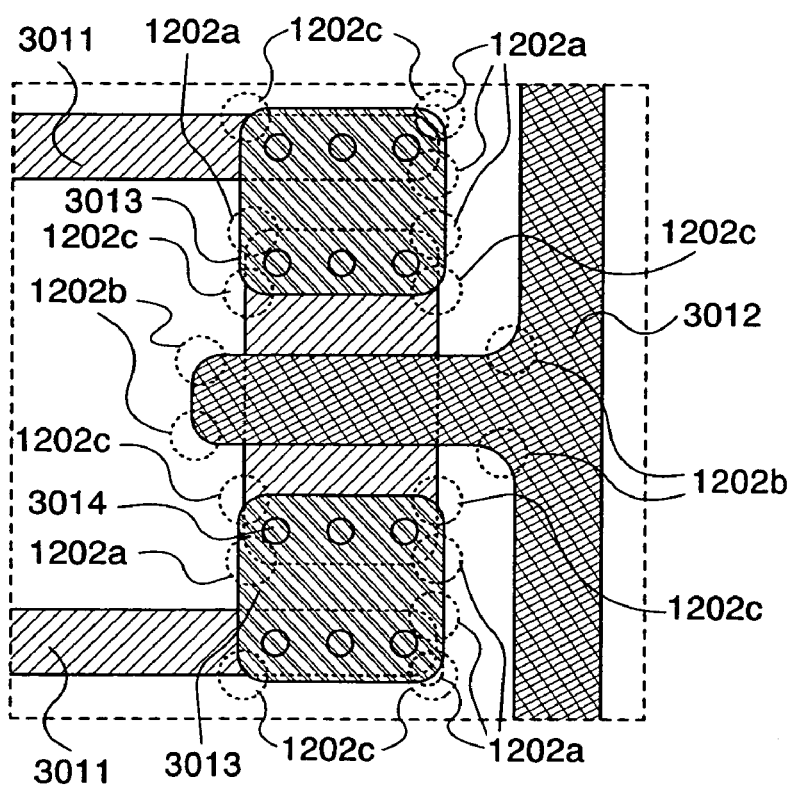
Figure 9A:
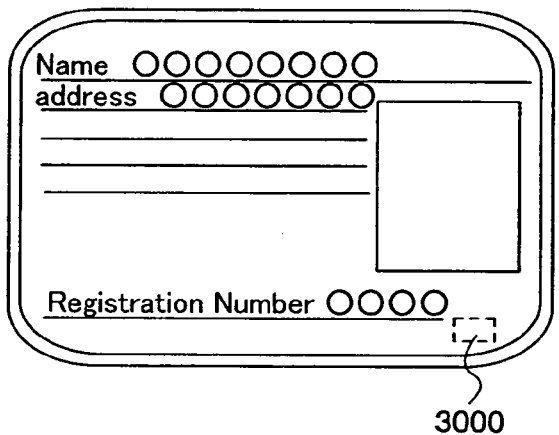
FIGS. 9A to 9E are views showing a structure of Embodiment 4.
Figure 9B:
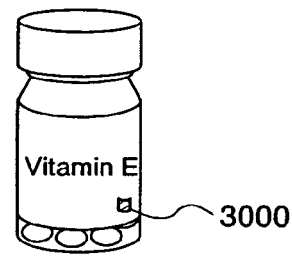
Figure 9C:
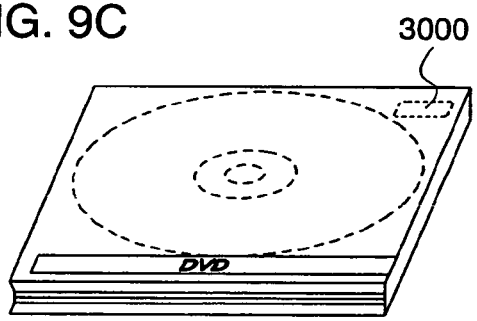
Figure 9D:
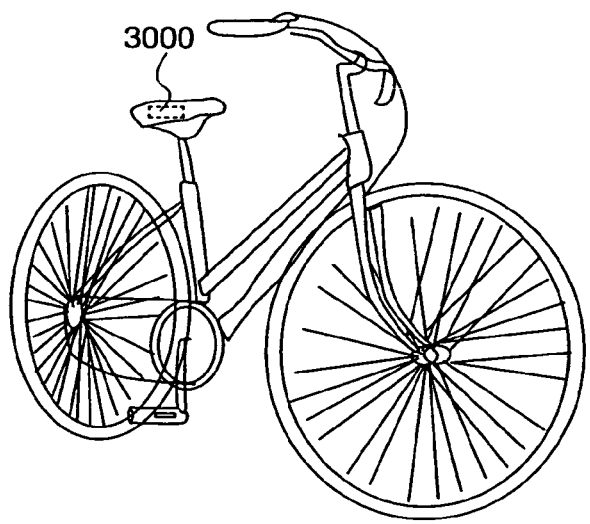
Figure 9E:
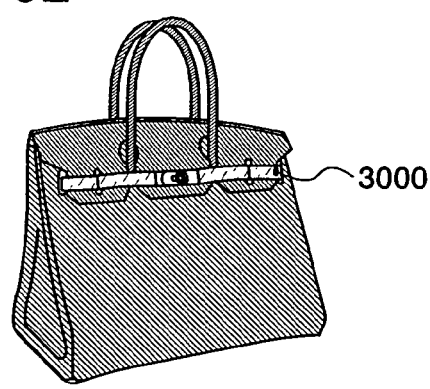

It is preferable that a wiring formed concurrently with (by the same step as) the semiconductor layer 662 be led so that corners are rounded when seen from a direction perpendicular to the top surface of the substrate 100. FIGS. 8A and 8B are schematic views each showing a method for leading the wiring. The wiring formed concurrently with (by the same step as) the semiconductor layer is denoted by a wiring 3011. FIG. 8A shows a conventional method for leading a wiring. FIG. 8B shows a method for leading a wiring of the present invention. Corners 1202a are rounded with respect to conventional corners 1201a. By making the corners round, dust or the like can be prevented from remaining at the corners of the wiring. As a result, defects of a semiconductor device caused by dust can be reduced and the yield can be improved.

An impurity element imparting a conductivity type may be added to the channel formation region 662a of a thin film transistor. As a result, threshold voltage of the thin film transistor can be controlled.

A first insulating layer 663 is formed over the semiconductor layer 662. The first insulating layer 663 can be formed of a single layer or a stacked layer including a plurality of films using silicon oxide, silicon nitride, silicon nitride oxide, or the like. In this case, a surface of the first insulating layer 663 may be processed by high-density plasma treatment in an oxygen atmosphere or a nitrogen atmosphere, and may be processed by oxidation treatment or nitriding treatment to be densified. As described above, high-density plasma is generated by using a high frequency, for example, 2.45 GHz. It is to be noted that high-density plasma with an electron density within the range of $10^{11}$ to $10^{13}/cm^3$, an electron temperature of less than or equal to 2 eV, and an ion energy of less than or equal to 5 eV is used. Plasma can be generated using a plasma treatment apparatus utilizing high frequency excitation, which employs a radial slot antenna. In the apparatus for generating high-density plasma, a distance between the antenna which generates a high frequency and the first substrate 100 is within the range of 20 to 80 mm (preferably, 20 to 60 mm).

Before forming the first insulating layer 663, the above high-density plasma treatment may be performed with respect to the surface of the semiconductor layer 662 so that the surface of the semiconductor layer is oxidized or nitrided. At this time, by performing the treatment in an oxygen atmosphere or a nitrogen atmosphere with the first substrate 100 at a temperature within the range of 300 to 450° C., a favorable interface with the first insulating layer 663 which is deposited over the semiconductor layer 662, can be formed.

As the nitrogen atmosphere, an atmosphere containing nitrogen (N) and a rare gas (containing at least one of He, Ne, Ar, Kr, and Xe), an atmosphere containing nitrogen, hydrogen (H), and a rare gas, or an atmosphere containing ammonia ($NH_3$) and a rare gas can be used. As the oxygen atmosphere, an atmosphere containing oxygen (O) and a rare gas, an atmosphere containing oxygen, hydrogen (H), and a rare gas, or an atmosphere containing dinitrogen monoxide ($N_2O$) and a rare gas can be used.

A gate electrode 664 is formed over the first insulating layer 663. As the gate electrode 664, an element selected from Ta, W, Ti, Mo, Al, Cu, Cr, and Nd, or an alloy or a compound containing a plurality of the above elements can be used. In addition, the gate electrode 664 may have a single layer structure or a stacked layer structure including these elements, the alloy, or the compound. In the drawings, the gate electrode 664 having a single layer structure is shown. It is preferable that the gate electrode 664 or a wiring formed concurrently with (by the same step as) the gate electrode 664 be led so that corners are rounded when seen from a direction perpendicular to the top surface of the first substrate 100. A method for leading the wiring can be the same as that shown in FIG. 8B. The gate electrode 664 or the wiring formed concurrently with (by the same step as) the gate electrode 664 is denoted by a wiring 3012. By making corners 1202b round with respect to corners 1201b, dust or the like can be prevented from remaining at the corners of the wiring. As a result, defects of a semiconductor device caused by dust can be reduced and the yield can be improved.

The thin film transistor includes the semiconductor layer 662, the gate electrode 664, and the first insulating layer 663 serving as a gate insulating film between the semiconductor layer 662 and the gate electrode 664. Although the thin film transistor is a top gate transistor in this embodiment mode, it may be a bottom gate transistor having a gate electrode below the semiconductor layer. Alternatively, a dual gate transistor having gate electrodes above and below the semiconductor layer may be used.

An insulating film (referred to as a sidewall 667a in FIGS. 7A to 7D) is provided so as to be in contact with the side face of the gate electrode 664. By adding an impurity element imparting a conductivity type to the semiconductor layer 662 after forming the sidewall 667a, the low concentration impurity region 662c can be formed in a self-aligning manner. In addition, a structure in which silicide is formed in the pair of the low concentration impurity regions 662b may be formed in a self-aligning manner by using the sidewall 667a. It is to be noted that, although a structure in which the sidewall 667a is provided is shown, without being limited thereto, the sidewall may not be provided.

A second insulating layer 667 is formed over the gate electrode 664 and the sidewall 667a. It is desirable that the second insulating layer 667 be an insulating film such as a silicon nitride film, with a barrier property for blocking an ionic impurity. For example, the second insulating layer 667 is formed of silicon nitride or silicon oxynitride. This second insulating layer 667 serves as a protective film for preventing contamination of the semiconductor layer 662. After depositing the second insulating layer 667, a hydrogen gas may be introduced and the above-described high-density plasma treatment may be performed, whereby the second insulating layer 667 may be hydrogenated. Alternatively, the second insulating layer 667 may be nitrided and hydrogenated by introducing an ammonia ($NH_3$) gas. Otherwise, oxidization-nitridation treatment and hydrogenation treatment may be performed on the second insulating layer 667 by introducing oxygen, a dinitrogen monoxide ($N_2O$) gas, or the like with a hydrogen gas. By performing nitriding treatment, oxidization treatment, or oxidization-nitridation treatment in this manner, the surface of the second insulating layer 667 can be densified. As a result, the function of the second insulating layer 667 as a protective film can be enhanced. Hydrogen introduced into the second insulating layer 667 is discharged when thermal treatment is performed at a temperature within the range of 400 to 450° C., whereby the semiconductor layer 662 can be hydrogenated. It is to be noted that the hydrogenation treatment may be performed in combination with hydrogenation treatment of the first insulating layer 663.

A third insulating layer 665 is formed over the second insulating layer 667. The third insulating layer 665 can have a single layer structure of a stacked layer structure of an inorganic insulating film or an organic insulating film. As the inorganic insulating film, a silicon oxide film formed by a CVD method, a silicon oxide film formed by an SOG (spin on glass) method, or the like can be used. As the organic insulating film, a film of polyimide, polyamide, BCB (benzocyclobutene), acrylic, a positive photosensitive organic resin, a negative photosensitive organic resin, or the like can be used.

The third insulating layer 665 may be made of a material having a skeleton structure formed of a bond of silicon (Si) and oxygen (O). An organic group containing at least hydrogen (such as an alkyl group and an aromatic hydrocarbon) is used as a substituent of this material. Alternatively, a fluoro group may be used as the substituent. Further alternatively, a fluoro group and an organic group containing at least hydrogen may be used as the substituent.

The wiring 666 is formed over the third insulating layer 665. The wiring 666 can be formed of one element selected from Al, Ni, W, Mo, Ti, Pt, Cu, Ta, Au, and Mn, or an alloy containing a plurality of the above elements. Alternatively, a single layer structure or a stacked layer structure of these elements or the alloy can be used. In the drawings, an example of a single layer structure is shown. It is to be noted that the wiring 666 is preferably led so that corners thereof are rounded when seen from the direction perpendicular to the top surface of the first substrate 100. A method for leading the wiring can be the same as that shown in FIG. 8B. The wiring 666 is denoted by a wiring 3013. By making corners round as in the corners 1202c with respect to the corners 1201c, dust or the like can be prevented from remaining at the corners of the wiring. As a result, defects of a semiconductor device caused by dust can be reduced and the yield can be improved. The wiring 3013 is connected to the wiring 3011 by a contact hole 3014. The wiring 666 becomes a wiring to be connected to a source or a drain of the thin film transistor.

A fourth insulating layer 669 is formed over the wiring 666. The fourth insulating layer 669 can have a single layer structure of a stacked layer structure of an inorganic insulating film or an organic insulating film. As the inorganic insulating film, a silicon oxide film formed by a CVD method, a silicon oxide film formed by an SOG method, or the like can be used. As the organic insulating film, a film of polyimide, polyamide, BCB (benzocyclobutene), acrylic, a positive photosensitive organic resin, a negative photosensitive organic resin, or the like can be used.

The fourth insulating layer 669 may be made of a material having a skeleton structure formed of a bond of silicon (Si) and oxygen (O). An organic group containing at least hydrogen (such as an alkyl group and an aromatic hydrocarbon) is used as a substituent of this material. Alternatively, a fluoro group may be used as the substituent. Further alternatively, a fluoro group and an organic group containing at least hydrogen may be used as the substituent.

An electrode 134 is formed over the fourth insulating layer 669. The electrode 134 can be formed from one element selected from Al, Ni, W, Mo, Ti, Pt, Cu, Ta, Au, and Mn, or an alloy containing a plurality of the above elements. Alternatively, a single layer structure or a stacked layer structure of these elements or the alloy can be used. In the drawings, an example of a single layer structure is shown.

Figure 7C:
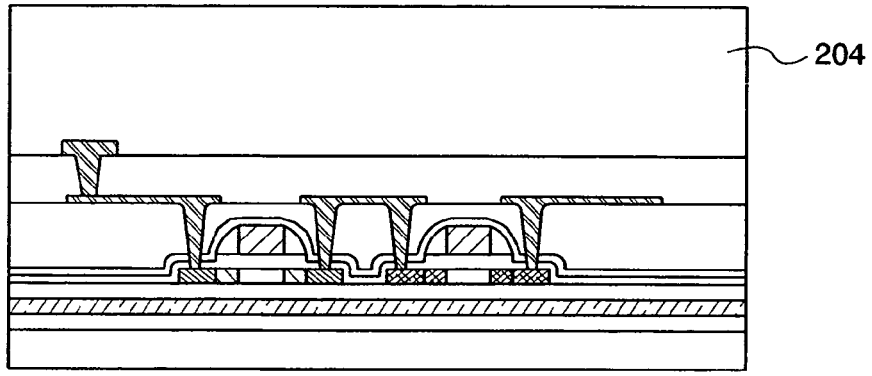

As shown in FIG. 7C, an insulating layer 204 is formed over the electrode 134. The insulating layer 204 corresponds to a second insulating layer 204a, a fourth insulating layer 204b, a sixth insulating layer 204c, and a seventh insulating layer 204d in FIGS. 3A to 3F, FIGS. 4A to 4F, FIGS. 5A to 5F, and FIGS. 6A to 6D. It is to be noted that, instead of the insulating layer 204, an insulating layer corresponding to a first insulating layer 203a, a third insulating layer 203b, and a fifth layer insulating layer 203c in FIGS. 3A to 3F, FIGS. 4A to 4F, FIGS. 5A to 5F, and FIGS. 6A to 6D may be provided.

Figure 7D:
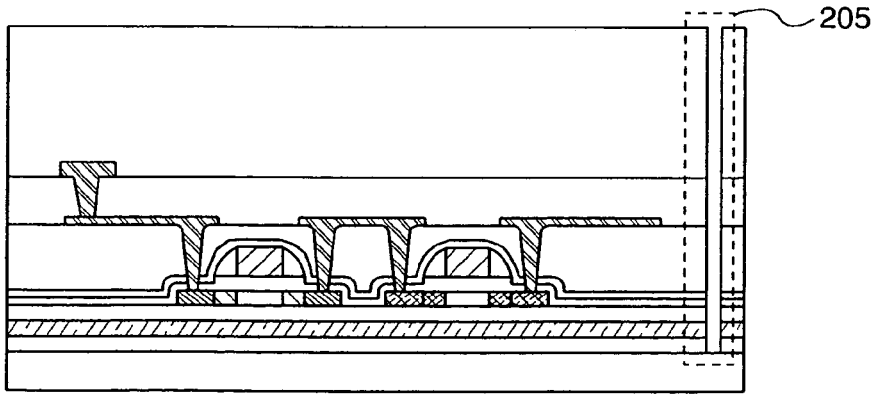

As shown in FIG. 7D, an opening 205 is provided. The opening 205 is provided in the same method as that shown in FIG. 3D in Embodiment Mode 1. The opening 205 is provided so that part of the peeling layer 712 is exposed. The manufacturing method shown in this embodiment mode can be applied to any steps shown in FIGS. 3A to 3F, FIGS. 4A to 4F, FIGS. 5A to 5F, and FIGS. 6A to 6D.

When the present invention is applied to a method for manufacturing an RFID (radio frequency identification) tag (also referred to as a wireless tag, an IC tag, an IC chip, an RF tag, an electronic tag, or a transponder), the electrode 134 can be an electrode connected to an antenna. It is to be noted that an antenna may be formed over an insulating surface where the electrode 134 is formed (that is, the surface of the fourth insulating layer 669). When the antenna is formed over the insulating surface (that is, the surface of the fourth insulating layer 669) where the electrode 134 is formed (that is, when the antenna and the semiconductor integrated circuit are formed in an integrated manner), the step of connecting the semiconductor integrated circuits, which are peeled from the first substrate 100, and the antenna is not necessary. Therefore, an RFID tag can be manufactured at low cost.

Consequently, a method for manufacturing a semiconductor device with high reliability can be provided.

This embodiment mode can be implemented by being freely combined with Embodiment Modes 1 and 2.

EMBODIMENT 1

In this embodiment, a structure of an RFID tag which can be manufactured by the present invention will be explained. Moreover, a wireless communication system using the RFID tag will be explained.

FIG. 11A shows a structure of a wireless communication system including an RFID tag 3000 and a reader/writer 2201 for communicating data with the RFID tag 3000 by wireless communication. The RFID tag 3000 includes an antenna 2202, and a circuit portion 2203 which inputs and outputs signals to/from the antenna 2202. The circuit portion 2203 corresponds to the semiconductor integrated circuit explained in Embodiment Modes. The reader/writer 2201 includes an antenna 2206 and a circuit portion 2207 which inputs and outputs signals to/from the antenna 2206. The RFID tag 3000 and the reader/writer 2201 input and output data, by transmitting and receiving a modulated carrier wave (also referred to as a wireless signal) using the antenna 2202 and the antenna 2206. The circuit portion 2203 includes an analog portion 2204 and a digital portion 2205. The analog portion 2204 inputs and outputs signals to/from the antenna 2202. The digital portion 2205 inputs and outputs signals to/from the analog portion 2204.

FIG. 11B shows a structure of the analog portion 2204 and the digital portion 2205. The analog portion 2204 includes a resonant capacitor 2501, a band-pass filter 2502, a power supply circuit 2503, a demodulation circuit 2506, and a modulation circuit 2507. The resonant capacitor 2501 is provided so that the antenna 2202 can easily receive a signal at a predetermined frequency. The digital portion 2205 includes a code extraction circuit 2301, a code determination circuit 2302, a cyclic redundancy check circuit 2303, a memory circuit 2305, and a control circuit 2304.

A case where the RFID tag 3000 receives data will be explained. A modulated carrier wave inputted from the antenna 2202, from which noise is removed by the band-pass filter 2502, is inputted to the power supply circuit 2503 and the demodulation circuit 2506. The power supply circuit 2503 has a rectifier circuit and a storage capacitor. The modulated carrier wave inputted through the band-pass filter 2502 is rectified by the rectifier circuit and smoothed by the storage capacitor. In this manner, the power supply circuit 2503 generates a DC voltage. A DC voltage generated in the power supply circuit 2503 is supplied as a power supply voltage to each circuit in the circuit portion 2203 included in the RFID tag 3000. It is to be noted that the power supply voltage outputted from the power supply circuit 2503 may be supplied to each circuit in the circuit portion 2203 through a constant voltage circuit (a regulator). The modulated carrier wave inputted through the band-pass filter 2502 is demodulated by the demodulation circuit 2506, and the demodulated signal is inputted to the digital portion 2205. A signal inputted from the analog portion 2204, that is, a signal which is made by demodulating the modulated carrier wave by the demodulation circuit 2506, is inputted to the code extraction circuit 2301, and a code of the signal is extracted. An output of the code extraction circuit 2301 is inputted to the code determination circuit 2302, and the extracted code is analyzed. The analyzed code is inputted to the cyclic redundancy check circuit 2303, and an arithmetic processing for identifying a transmission error is performed. Then, the cyclic redundancy check circuit 2303 outputs to the control circuit 2304 a result whether the received data has an error or not. It is to be noted that a phase synchronization circuit generating a clock at a predetermined frequency, which is synchronized with a signal, using an output of the demodulation circuit 2506 may be included. As the phase synchronization circuit, a phase locked loop circuit (a PLL circuit) can be used.

Next, a case where the RFID tag 3000 transmits data will be explained. The memory circuit 2305 outputs a stored unique identifier (UID) to the control circuit 2304, in response to a signal inputted from the code determination circuit 2302. The memory circuit includes a memory, and a memory controller which controls reading of data from the memory. A mask ROM can be used as the memory. The cyclic redundancy check circuit 2303 calculates the CRC code corresponding to the transmitted data and outputs the CRC code to the control circuit 2304. The control circuit 2304 adds the CRC code to the transmitted data. The control circuit 2304 encodes data in which the CRC code is added to the transmitted data. In addition, the control circuit 2304 converts the encoded information into a signal for modulating the carrier wave in accordance with a predetermined modulation method. The output of the control circuit 2304 is inputted to the modulation circuit 2507 of the analog portion 2204. The modulation circuit 2507 load-modulates the carrier wave in accordance with the inputted signal and outputs the carrier wave to the antenna 2202.

A semiconductor device having a pouch structure is obtained by a manufacturing method of a semiconductor device (an RFID tag) of the present invention. Accordingly, a manufacturing method of an RFID tag with high reliability can be provided.

This embodiment can be implemented by being freely combined with the embodiment modes described above.

EMBODIMENT 2

In this embodiment, a manufacturing method of a memory (corresponding to a memory included in the memory circuit 2305 in FIGS. 11A and 11B) included in an RFID tag which can be manufactured by the present invention will be explained. An example of using a mask ROM as the memory will be explained.

The mask ROM is formed using a plurality of transistors, and the transistor which forms the mask ROM is formed using photolithography. In the case, a selection is performed whether a contact hole for a wiring connected to, for example, a drain region of the transistor is opened or not in an interlayer insulating film formed over the transistor. Thus, different data can be written. For example, data of a logical value "1" can be written into a memory cell in a case where the contact hole is opened, and alternatively, data of a logical value "0" can be written into the memory cell in a case where the contact hole is not opened.

In a step of exposing a photoresist, before or after a step of performing exposure through a reticle (a photomask) by an exposure apparatus such as a stepper, a photoresist over a region in which the contact hole is to be opened is irradiated with an electron beam or a laser. Thereafter, a step such as development, etching, or peeling of the photoresist is performed as usual. Accordingly, only by selecting a region to be irradiated with an electron beam or a laser, a pattern in which the contact hole is opened and a pattern in which the contact hole is not opened can be selectively manufactured without changing a reticle (a photomask). In other words, by selecting the region to be irradiated with an electron beam or a laser, a mask ROM in which different data is written in each semiconductor device can be manufactured without changing a reticle (a photomask).

By using such a manufacturing method of a mask ROM, a unique identifier (UID) can be set for each semiconductor device in manufacturing. The reticle (photomask) is not necessary to be changed also in a case of setting a different UID; therefore, a semiconductor device can be manufactured at lower cost.

Further, an RFID tag which can be manufactured by the present invention may include, instead of a mask ROM, a memory capable of additional writing or a memory capable of rewriting. In addition, both of the mask ROM, and the memory capable of additional writing and/or the memory capable of rewriting may be included.

A semiconductor device having a pouch structure is obtained by a manufacturing method of a semiconductor device (an RFID tag) of the present invention. Accordingly, a manufacturing method of an RFID tag with high reliability can be provided.

This embodiment can be implemented by being freely combined with the embodiment modes and Embodiment 1 described above.

EMBODIMENT 3

In this embodiment, a carrier wave of wireless communication in an RFID tag which can be manufactured by the present invention will be explained.

As for a frequency of a carrier wave, any of the following can be employed: a submillimeter wave of greater than or equal to 300 GHz and less than or equal to 3 THz; an extremely high frequency of greater than or equal to 30 GHz and less than 300 GHz; a super high frequency of greater than or equal to 3 GHz and less than 30 GHz; an ultra high frequency of greater than or equal to 300 MHz and less than 3 GHz; a very high frequency of greater than or equal to 30 MHz and less than 300 MHz; a high frequency of greater than or equal to 3 MHz and less than 30 MHz; a medium frequency of greater than or equal to 300 KHz and less than 3 MHz; a low frequency of greater than or equal to 30 KHz and less than 300 KHz; and a very low frequency of greater than or equal to 3 KHz and less than 30 KHz. For example, a carrier wave at a frequency of 13.56 MHz may be used or a carrier wave at a frequency of 2.45 GHz may be used.

A shape of the antenna included in the RFID tag can be changed in accordance with the frequency of a carrier wave or a transmission system. For example, the antenna may have a coil shape in a case of utilizing an electromagnetic induction type, or the antenna may have a dipole shape in a case of utilizing a super high frequency type.

By using a manufacturing method of a semiconductor device (an RFID tag) of the present invention, a pouch structure is obtained. Accordingly, a manufacturing method of an RFID tag with high reliability can be provided.

This embodiment can be implemented by being freely combined with the embodiment modes and Embodiments 1 and 2 described above.

EMBODIMENT 4

In this embodiment, applications of an RFID tag which can be manufactured by the present invention will be explained with reference to FIGS. 9A to 9E. An RFID tag 3000 has a feature that an antenna is provided and data is inputted and outputted by wireless communication through the antenna. The RFID tag 3000 can be applied to paper money, coins, securities, bearer bonds, certificates (a driver's license or a resident's card; see FIG. 9A), packaging containers (wrapping paper or a bottle; see FIG. 9B), recording media (see FIG. 9C) such as DVD software, a CD, and a video tape. In addition, the RFID tag 3000 can be applied to vehicles (see FIG. 9D) such as cars, motor bicycles, and bicycles, personal belongings (see FIG. 9E) such as bags and glasses, groceries, clothes, daily commodities, electronic devices, and the like. The electronic devices include liquid crystal display devices, EL (electroluminescence) display devices, television devices (also simply referred to as televisions or television receivers), portable phones, and the like.

The RFID tag 3000 can be attached to a surface of an object or embedded in an object, to be fixed. For example, the RFID tag 3000 is preferably embedded in a paper of a book or in an organic resin of a package which is formed using the organic resin. By providing the RFID tag 3000 in paper money, coins, securities, bearer bonds, certificates, or the like, forgery thereof can be prevented. Moreover, by providing the RFID tag 3000 in packaging containers, recording media, personal belongings, groceries, clothes, daily commodities, electronic devices, or the like, efficiency of an inspection system or a system of a rental shop can be facilitated. Moreover, by providing the RFID tag 3000 in vehicles, forgery or theft thereof can be prevented. By implanting the RFID tag 3000 in living things such as animals, each living thing can be easily identified. For example, by implanting the RFID tag 3000 in living things such as domestic animals, its year of birth, sex, breed, and the like can be easily identified.

A semiconductor device having a pouch structure is obtained by a manufacturing method of a semiconductor device (an RFID tag) of the present invention. Accordingly, a manufacturing method of an RFID tag with high reliability can be provided.

This embodiment can be implemented by being freely combined with the embodiment modes and embodiments 1 to 3 described above.

EMBODIMENT 5

Figure 10A:
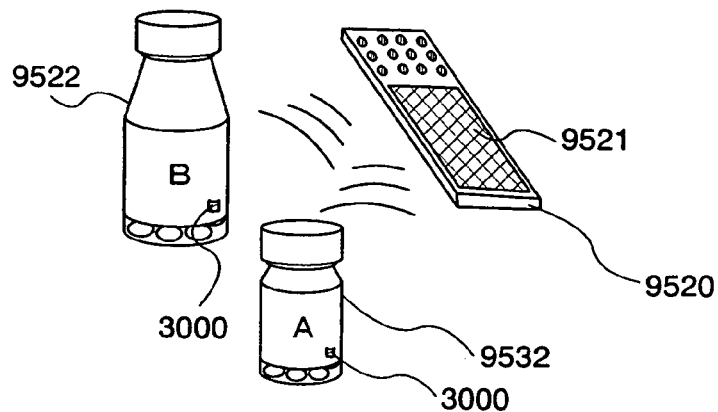
FIGS. 10A to 10C are views showing a structure of Embodiment 5.
Figure 10B:
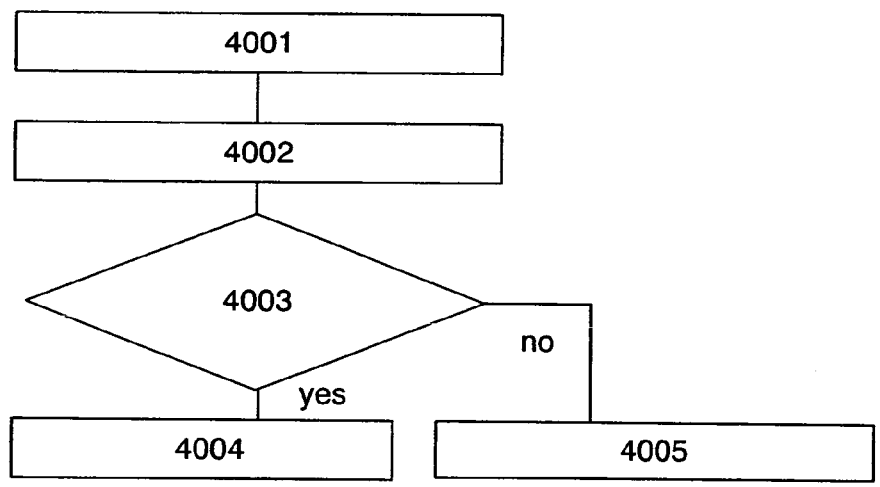

In this embodiment, one mode of a wireless communication system utilizing an RFID tag 3000 which can be manufactured by the present invention will be explained with reference to FIGS. 10A to 10C. A terminal 9520 including a display portion 9521 is provided with an antenna and a reader/writer connected to the antenna. An object A 9532 is provided with an RFID tag 3000, and an object B 9522 is also provided with an RFID tag 3000. In FIG. 10A, an internal medicine is shown as an example of the object A or the object B. When the antenna of the terminal 9520 is held near the RFID tag 3000 of the object A 9532, the display portion 9521 displays information on the object A 9532, such as a raw material, a place of origin, a test result in each production process, a record of distribution, and description of the object. When the antenna of the terminal 9520 is held near the RFID tag 3000 of the object B 9522, the display portion 9521 displays information on the object B 9522, such as a raw material, a place of origin, a test result in each production process, a record of distribution, and description of the object.

An example of a business model utilizing the system shown in FIG. 10A will be explained with reference to a flow chart shown in FIG. 10B. Information on allergy is inputted to a terminal 9520 (a first step 4001). The information on allergy is information on medical products, their components, or the like that may cause allergic reactions to certain people. As described above, information on the internal medicine A, which is the object A 9532, is obtained by the antenna provided for the terminal 9520 (a second step 4002). The information on the internal medicine A includes information on the components or the like of the internal medicine A. The information on allergy is compared with the obtained information on the components or the like of the internal medicine A, thereby determining whether a corresponding component is contained or not (a third step 4003). If the corresponding component is contained, a user of the terminal 9520 is alerted that the certain people may have allergic reactions to the internal medicine A (a fourth step 4004). If the corresponding component is not contained, the user of the terminal 9520 is informed that the certain people are at low risk of having allergic reactions to the internal medicine A (the fact that the internal medicine A is safe) (a fifth step 4005). In the fourth step 4004 or the fifth step 4005, in order to inform the user of the terminal 9520 of the information, the information may be displayed on the display portion 9521 of the terminal 9520, or an alarm or the like of the terminal 9520 may be sounded.

Figure 10C:
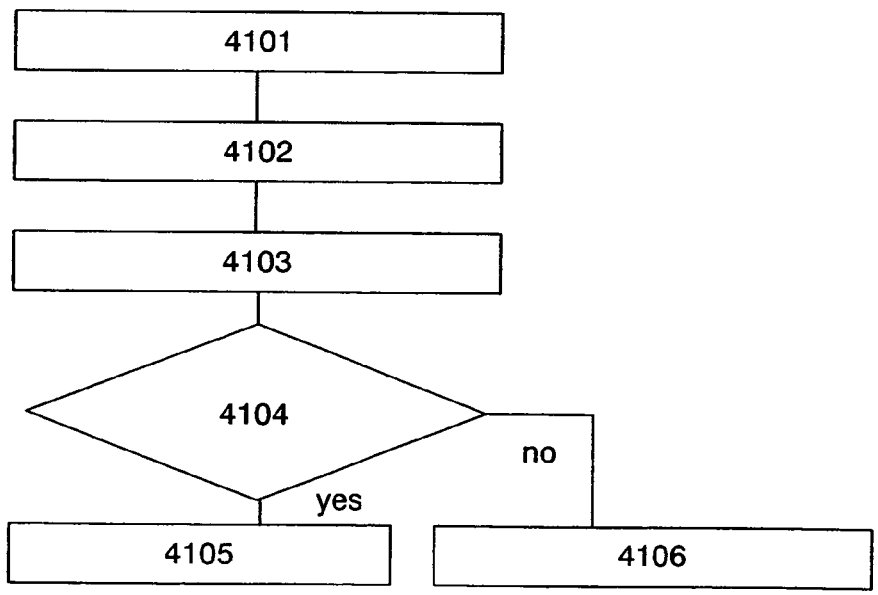

Alternatively, FIG. 10C shows another example of a business model. Information on a combination of internal medicines which are dangerous when used simultaneously or a combination of components of internal medicines which are dangerous when used simultaneously (hereinafter, referred to as combination information) is inputted to a terminal 9520 (a first step 4101). As described above, information on the internal medicine A, which is the object A 9532, is obtained by an antenna provided for the terminal 9520 (a second step 4102). The information on the internal medicine A includes information on components or the like of the internal medicine A. Next, as described above, information on the internal medicine B, which is the object B 9522, is obtained by the antenna provided for the terminal 9520 (a third step 4103). The information on the internal medicine B includes information on components or the like of the internal medicine B. In this way, information on a plurality of internal medicines is obtained. The combination information is compared with the obtained information on the plurality of internal medicines, thereby determining whether or not a corresponding combination of components of internal medicines which are dangerous when used simultaneously is contained (a fourth step 4104). If the corresponding combination is contained, the user of the terminal 9520 is alerted (a fifth step 4105). If the corresponding combination is not contained, the user of the terminal 9520 is informed of the safety (a sixth step 4106). In the fifth step 4105 or the sixth step 4106, in order to inform the user of the terminal 9520 of the information, the information may be displayed on the display portion 9521 of the terminal 9520, or an alarm or the like of the terminal may be sounded.

A semiconductor device having a pouch structure is obtained by a manufacturing method of a semiconductor device (an RFID tag) of the present invention. Accordingly, a manufacturing method of an RFID tag with high reliability can be provided.

This embodiment can be implemented by being freely combined with the embodiment modes and embodiments 1 to 4 described above.

This application is based on Japanese Patent Application serial No. 2005-348780 filed in Japan Patent Office on Dec. 2, 2005, the entire contents of which are hereby incorporated by reference.

What is claimed is:

1. A manufacturing method of a semiconductor device comprising:

forming a plurality of first semiconductor integrated circuits, and a plurality of second semiconductor integrated circuits arranged to surround at least one of the plurality of first semiconductor integrated circuits, over a first substrate;

adhering a second substrate to cover the plurality of first semiconductor integrated circuits and the plurality of second semiconductor integrated circuits;

separating the first substrate and the second substrate from each other by applying an external force between the first substrate and the second substrate;

transferring the plurality of first semiconductor integrated circuits to a third substrate;

removing the second substrate;

forming a protective layer to cover a top surface and a side surface of the plurality of first semiconductor integrated circuits and a surface of the third substrate in a periphery of the plurality of first semiconductor integrated circuits; and dividing the third substrate and the protective layer so that the plurality of first semiconductor integrated circuits is divided into individual pieces and part of the third substrate remains in the periphery of the plurality of first semiconductor integrated circuits.

2. A manufacturing method of a semiconductor device comprising:

forming a plurality of first semiconductor integrated circuits, a plurality of second plurality of semiconductor integrated circuits each of which is arranged to be adjacent to one of the plurality of first semiconductor integrated circuits, a plurality of third semiconductor integrated circuits each of which is arranged to be adjacent to one of the plurality of first semiconductor integrated circuits and to one of the plurality of second semiconductor integrated circuits, and a plurality of fourth semiconductor integrated circuits each of which is arranged to be adjacent to one of the plurality of first semiconductor integrated circuits, to one of the plurality of second semiconductor integrated circuits, and to one of the plurality of third semiconductor integrated circuits, over a first substrate;

adhering a second substrate to cover the plurality of first semiconductor integrated circuits, the plurality of second semiconductor integrated circuits, the plurality of third semiconductor integrated circuits, and the plurality of fourth semiconductor integrated circuits;

separating the first substrate and the second substrate from each other by applying an external force between the first substrate and the second substrate;

transferring the plurality of first semiconductor integrated circuits to a third substrate;

removing the second substrate;

forming a protective layer to cover a top surface and a side surface of the plurality of first semiconductor integrated circuits and a surface of the third substrate in a periphery of the plurality of first semiconductor integrated circuits; and dividing the third substrate and the protective layer so that the plurality of first semiconductor integrated circuits is divided into individual pieces and part of the third substrate remains in the periphery of the plurality of first semiconductor integrated circuits.

3. A manufacturing method of a semiconductor device comprising:

forming a plurality of first semiconductor integrated circuits, and a plurality of second semiconductor integrated circuits arranged to surround at least one of the plurality of first semiconductor integrated circuits, over a first substrate, forming a first insulating layer to cover the plurality of second semiconductor integrated circuits;

forming a second insulating layer to cover the plurality of first semiconductor integrated circuits;

adhering a second substrate to cover the first insulating layer and the second insulating layer;

separating the first substrate and the second substrate from each other by applying an external force between the first substrate and the second substrate;

transferring the plurality of first semiconductor integrated circuits to a third substrate;

removing the second substrate;

forming a protective layer to cover a top surface and a side surface of the plurality of first semiconductor integrated circuits and a surface of the third substrate in a periphery of the plurality of first semiconductor integrated circuits; and dividing the third substrate and the protective layer so that the plurality of first semiconductor integrated circuits is divided into individual pieces and part of the third substrate remains in the periphery of the plurality of first semiconductor integrated circuits.

4. A manufacturing method of a semiconductor device comprising:

forming a plurality of first semiconductor integrated circuits, a plurality of second semiconductor integrated circuits each of which is arranged to be adjacent to one of the plurality of first semiconductor integrated circuits, a plurality of third semiconductor integrated circuits each of which is arranged to be adjacent to one of the plurality of first semiconductor integrated circuits and to one of the plurality of second semiconductor integrated circuits, and a plurality of fourth semiconductor integrated circuits each of which is arranged to be adjacent to one of the plurality of first semiconductor integrated circuits, to one of the plurality of second semiconductor integrated circuits, and to one of the plurality of third semiconductor integrated circuits, over a first substrate;

forming a first insulating layer to cover the plurality of second semiconductor integrated circuits, the plurality of third semiconductor integrated circuits, and the plurality of fourth semiconductor integrated circuits;

forming a second insulating layer to cover the plurality of first semiconductor integrated circuits;

adhering a second substrate to cover the first insulating layer and the second insulating layer;

separating the first substrate and the second substrate from each other by applying an external force between the first substrate and the second substrate;

transferring the plurality of first semiconductor integrated circuits to a third substrate;

removing the second substrate;

forming a protective layer to cover a top surface and a side surface of the plurality of first semiconductor integrated circuits and a surface of the third substrate in a periphery of the plurality of first semiconductor integrated circuits; and dividing the third substrate and the protective layer so that the plurality of first semiconductor integrated circuits is divided into individual pieces and part of the third substrate remains in the periphery of the plurality of first semiconductor integrated circuits.

5. A manufacturing method of a semiconductor device comprising:

forming a plurality of first semiconductor integrated circuits, and a plurality of second semiconductor integrated circuits arranged to surround at least one of the plurality of first semiconductor integrated circuits;

forming a first insulating layer to cover the plurality of second semiconductor integrated circuits;

forming a second insulating layer to cover the plurality of first semiconductor integrated circuits;

adhering a second substrate to cover the first insulating layer and the second insulating layer;

separating the first substrate and the second substrate from each other by applying an external force between the first substrate and the second substrate;

transferring the plurality of first semiconductor integrated circuits to a third substrate;

removing the second substrate;

forming a protective layer to cover a top surface and a side surface of the plurality of first semiconductor integrated circuits and a surface of the third substrate in a periphery of the plurality of first semiconductor integrated circuits; and dividing the third substrate and the protective layer so that the plurality of first semiconductor integrated circuits is divided into individual pieces and part of the third substrate remains in the periphery of the plurality of first semiconductor integrated circuits, wherein, with respect to the external force, an adhesive strength between the second insulating layer and the plurality of first semiconductor integrated circuits is higher than an adhesive strength between the first insulating layer and the plurality of second semiconductor integrated circuits, and is higher than a junction strength between the first substrate and the plurality of first semiconductor integrated circuits, and wherein, with respect to the external force, a junction strength between the first substrate and the plurality of second semiconductor integrated circuits is higher than an adhesive strength between the first insulating layer and the plurality of second semiconductor integrated circuits.

6. A manufacturing method of a semiconductor device comprising:

forming a plurality of first semiconductor integrated circuits, a plurality of second semiconductor integrated circuits each of which is arranged to be adjacent to one of the plurality of first semiconductor integrated circuits, a plurality of third semiconductor integrated circuits each of which is arranged to be adjacent to one of the plurality of first semiconductor integrated circuits and to one of the plurality of second semiconductor integrated circuits, and a plurality of fourth semiconductor integrated circuits each of which is arranged to be adjacent to one of the plurality of first semiconductor integrated circuits, to one of the plurality of second semiconductor integrated circuits, and to one of the plurality of third semiconductor integrated circuits, over a first substrate;

forming a first insulating layer to cover the plurality of second semiconductor integrated circuits, the plurality of third semiconductor integrated circuits, and the plurality of fourth semiconductor integrated circuits;

forming a second insulating layer to cover the plurality of first semiconductor integrated circuits;

adhering a second substrate to cover the first insulating layer and the second insulating layer;

separating the first substrate and the second substrate from each other by applying an external force between the first substrate and the second substrate;

transferring the plurality of first semiconductor integrated circuits to a third substrate;

removing the second substrate;

forming a protective layer to cover a top surface and a side surface of the plurality of first semiconductor integrated circuits and a surface of the third substrate in a periphery of the plurality of first semiconductor integrated circuits; and dividing the third substrate and the protective layer so that the plurality of first semiconductor integrated circuits is divided into individual pieces and part of the third substrate remains in the periphery of the plurality of first semiconductor integrated circuits, wherein, with respect to the external force, an adhesive strength between the second insulating layer and the plurality of first semiconductor integrated circuits is higher than an adhesive strength between the first insulating layer and each of the plurality of second semiconductor integrated circuits to the plurality of fourth semiconductor integrated circuits, and is higher than a junction strength between the first substrate and the plurality of first semiconductor integrated circuits, and wherein, with respect to the external force, a junction strength between the first substrate and each of the plurality of second semiconductor integrated circuits to the fourth semiconductor integrated circuits is higher than an adhesive strength between the first insulating layer and each of the plurality of second semiconductor integrated circuits to the plurality of fourth semiconductor integrated circuits.

7. The manufacturing method of a semiconductor device according to any one of claims 3 to 6, wherein the second insulating layer is formed using a resin material containing an epoxy group, and the first insulating layer is formed using a resin material containing a vinyl group.

8. The manufacturing method of a semiconductor device according to any one of claims 1, 3, and 5, further comprising a step of forming a peeling layer between the first substrate and the plurality of first and second semiconductor integrated circuits.

9. The manufacturing method of a semiconductor device according to any one of claims 2, 4, and 6, further comprising a step of forming a peeling layer between the first substrate and the first to the fourth plurality of semiconductor integrated circuits.

10. The manufacturing method of a semiconductor device according to any one of claims 2, 4, and 6, wherein the first to the fourth plurality of semiconductor integrated circuits are formed over the first substrate in a same step.

11. The manufacturing method of a semiconductor device according to any one of claims 2, 4, and 6, wherein at least two of the plurality of first to fourth semiconductor integrated circuits have a same configuration with each other.

12. The manufacturing method of a semiconductor device according to any one of claims 2, 4, and 6, wherein the plurality of first to fourth semiconductor integrated circuits have different configurations with each other.

13. The manufacturing method of a semiconductor device according to any one of claims 1 to 6, wherein a heat resistance of the first substrate is higher than that of the second substrate.

* * * * *